(12) United States Patent
Yu et al.

(10) Patent No.: US 11,372,453 B2
(45) Date of Patent: Jun. 28, 2022

(54) ELECTRONIC DEVICE

(71) Applicant: SHENZHEN ROYOLE TECHNOLOGIES CO., LTD., Guangdong (CN)

(72) Inventors: Hualing Yu, Guangdong (CN); Songya Chen, Guangdong (CN); Xiaofei Fan, Guangdong (CN); Zhuping Hong, Guangdong (CN); Yanguang Ya, Guangdong (CN); Wenjun Liu, Guangdong (CN); Shuai Su, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 11 days.

(21) Appl. No.: 16/929,587

(22) Filed: Jul. 15, 2020

(65) Prior Publication Data
US 2022/0019268 A1    Jan. 20, 2022

(30) Foreign Application Priority Data

Jul. 15, 2019  (CN) ................. PCT/CN2019/096011
Aug. 18, 2019  (CN) ................. PCT/CN2019/101253
(Continued)

(51) Int. Cl.
*G06F 1/16* (2006.01)
*H04M 1/02* (2006.01)
*G09F 9/30* (2006.01)

(52) U.S. Cl.
CPC .......... *G06F 1/1681* (2013.01); *G06F 1/1652* (2013.01); *G09F 9/301* (2013.01); *H04M 1/0216* (2013.01); *H04M 1/0268* (2013.01)

(58) Field of Classification Search
CPC ............. H04M 1/0208; H04M 1/0235; H04M 1/0237; G06F 1/1616; G06F 1/1624; G06F 1/1652
See application file for complete search history.

(56) References Cited

U.S. PATENT DOCUMENTS 9,874,906 B1 *  1/2018  Hsu ................. G06F 1/1681
10,659,576 B1 *  5/2020  Hsu ................. H04M 1/0268
(Continued)

FOREIGN PATENT DOCUMENTS

CN    105448194 A    3/2016
CN    105915680 A    8/2016
(Continued)

*Primary Examiner* — Anthony Q Edwards
(74) *Attorney, Agent, or Firm* — Hauptman Ham, LLP

(57) ABSTRACT

The present disclosure provides an electronic device, which comprises a first frame, a second frame, a bendable hinge located between the first frame and the second frame, and a flexible member covering the first frame, the second frame, and the bendable hinge. Wherein, the electronic device further comprises a sliding member located on one side of the bendable hinge, and a supporting member connecting the sliding member and the first frame. The flexible member connects the first frame and the second frame. When the bendable hinge is bent, the supporting member can drive the sliding member to slide relative to the bendable hinge, and the flexible member can drive the second frame to slide relative to the bendable hinge.

19 Claims, 23 Drawing Sheets

(30) Foreign Application Priority Data

| Aug. 18, 2019 | (CN) | .................. PCT/CN2019/101260 |
| Aug. 30, 2019 | (CN) | .................. PCT/CN2019/103742 |
| Sep. 4, 2019 | (CN) | .................. PCT/CN2019/104429 |
| Oct. 21, 2019 | (CN) | .................. PCT/CN2019/112388 |

(56) References Cited

U.S. PATENT DOCUMENTS

| | | |
|---|---|---|
| 11,048,305 B1* | 6/2021 | Ye .......................... G06F 1/1652 |
| 2012/0044620 A1 | 2/2012 | Song et al. |
| 2015/0233162 A1 | 8/2015 | Lee et al. |
| 2016/0018855 A1* | 1/2016 | Liao ....................... G06F 1/1652 |
| | | 361/679.56 |
| 2016/0295709 A1 | 10/2016 | Ahn |
| 2017/0208699 A1 | 7/2017 | McDermid |
| 2017/0227993 A1 | 8/2017 | Holung et al. |
| 2018/0110139 A1 | 4/2018 | Seo et al. |
| 2019/0112852 A1 | 4/2019 | Hsu |
| 2019/0174645 A1 | 6/2019 | Jeon et al. |
| 2020/0133340 A1* | 4/2020 | Ou ......................... G06F 1/1616 |
| 2020/0253069 A1* | 8/2020 | Cha ........................ G09F 9/301 |
| 2020/0326757 A1* | 10/2020 | Huang ................. H04M 1/0268 |
| 2021/0271294 A1* | 9/2021 | Liao ........................ F16C 11/04 |

FOREIGN PATENT DOCUMENTS

| | | |
|---|---|---|
| CN | 106486018 A | 3/2017 |
| CN | 206100081 U | 4/2017 |
| CN | 106910424 A | 6/2017 |
| CN | 206369990 U | 8/2017 |
| CN | 207200775 U | 4/2018 |
| CN | 108076171 A | 5/2018 |
| CN | 207589333 U | 7/2018 |
| CN | 108428408 A | 8/2018 |
| CN | 207782858 U | 8/2018 |
| CN | 108712538 A | 10/2018 |
| CN | 208173128 U | 11/2018 |
| CN | 108965500 A | 12/2018 |
| CN | 108965502 A | 12/2018 |
| CN | 109002079 A | 12/2018 |
| CN | 208595386 U | 3/2019 |
| CN | 109661131 A | 4/2019 |
| CN | 208734715 U | 4/2019 |
| CN | 208804113 U | 4/2019 |
| CN | 109780403 A | 5/2019 |
| CN | 109887417 A | 6/2019 |
| CN | 209029007 U | 6/2019 |
| KR | 20180030435 A | 3/2018 |
| TW | M559431 U | 5/2018 |

* cited by examiner

ELECTRONIC DEVICE

CROSS-REFERENCE TO RELATED APPLICATIONS

This application claims priority to PCT Patent Application No. PCT/CN2019/112388, filed on Oct. 21, 2019, and PCT Patent Application No. PCT/CN2019/103742, filed on Aug. 30, 2019, and PCT Patent Application No. PCT/CN2019/104429, filed on Sep. 4, 2019, and PCT Patent Application No. PCT/CN2019/101253, filed on Aug. 18, 2019, and PCT Patent Application No. PCT/CN2019/101260, filed on Aug. 18, 2019, and PCT Patent Application No. PCT/CN2019/096011, filed on Jul. 15, 2019, the content of which are hereby incorporated by reference in their entirety.

TECHNICAL FIELD

The present disclosure relates to a field of a supporting for a flexible member, in particular to an electronic device for supporting the flexible member.

BACKGROUND

With the development of display equipments, bendable electronic screens have been emerged, that is, flexible screens. Compared with traditional display devices, the flexible screens have advantages of foldability and flexibility, and are widely favored by consumers. Because the flexible screen is relatively fragile and easily damaged when subjected to a large tensile force, therefore, how to design a compensation structure to reduce or avoid the flexible screen from being damaged has becomes a problem that the industry has always sought to solve.

SUMMARY

The present disclosure provides an electronic device capable of preventing flexible members (including flexible screens, flexible sensors, etc.) from being easily damaged.

The present disclosure provides an electronic device, which includes a first frame, a second frame, a bendable hinge located between the first frame and the second frame, and a flexible member covering the first frame, the second frame and the bendable hinge. The electronic device further includes a sliding member located on one side of the bendable hinge, and a supporting member connecting the sliding member and the first frame; the flexible member connects the first frame and the second frame; when the bendable hinge is bent, the supporting member drives the sliding member to slide relative to the bendable hinge, and the flexible member drives the second frame to slide relative to the bendable hinge.

The flexible member of the rotating mechanism of the electronic device of the present disclosure connects the first frame and the second frame, and covers the first frame, the second frame and the bendable hinge located between the first frame and the second frame. When the bendable hinge is bent, the flexible member can drive the second frame to slide relative to the bendable hinge which reduces a tensile force subjected by the flexible member during bending, thereby reducing or avoiding damage to the flexible member.

BRIEF DESCRIPTION OF THE ACCOMPANYING DRAWINGS

In order to more clearly explain the technical solutions of the embodiments of the present disclosure, the drawings required in the embodiments will be briefly introduced below. Obviously, the drawings in the following description are some embodiments of the present disclosure. In terms of technicians, other drawings can be obtained based on these drawings without any creative work.

DETAILED DESCRIPTION OF ILLUSTRATED EMBODIMENTS

Figure 1:
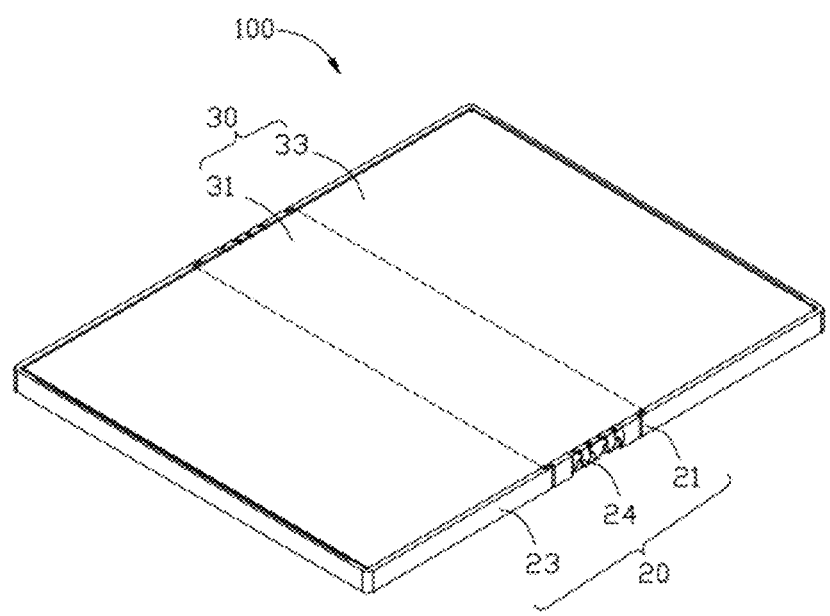
FIG. 1 is a three-dimensional schematic diagram of an electronic device according to one embodiment of the present disclosure.

The technical solutions in the embodiments of the present disclosure will be described clearly and completely with reference to the drawings in the embodiments of the present disclosure. Obviously, the described embodiments are only a part of the embodiments of the present disclosure, but not all the embodiments. Based on the embodiments of the present disclosure, all other embodiments obtained by those of ordinary skill in the art without paying any creative work fall within the protection scope of the present disclosure.

In the description of the embodiments of the present disclosure, it should be understood that the orientations or positional relationships indicated by the terms "upper", "lower", "left" and "right" are based on the orientations or positional relationships shown in the drawings, only for convenience of describing the present disclosure and simplifying the description, rather than implying or indicating that the device or element must have a specific orientation, be constructed and operate in a specific orientation, and therefore cannot be construed as limiting the present disclosure.

Please referring to FIGS. 1 to 5, an electronic device 100 in one embodiment of the present disclosure includes a housing 20, a flexible member 30 located on the housing 20, and a supporting member 50 located between the housing 20 and the flexible member 30. In this embodiment, the supporting member 50 is a bendable supporting piece. The housing 20 includes a first frame 21, a second frame 23, and a bendable assembly 24 connected between the first frame 21 and the second frame 23. The supporting member 50 at least covers a hinge body 25. The flexible member 30 is located on the first frame 21, the supporting member 50, and the second frame 23. The flexible member 30 includes a bendable region 31 corresponding to the bendable assembly 24, and two non-bendable regions 33 connected to opposite sides of the bendable region 31. The bendable assembly 24 is configured to support the bendable region 31 of the flexible member 30. The supporting member 50 and the flexible member 30 follows the bendable assembly 24 to be bent or unfolded. The bendable assembly 24 includes a hinge body 25. The hinge body 25 can be bent to drive the bendable assembly 24 to be bent. Alternatively, the bendable assembly 24 may further include at least one rotating mechanism 26 located on the hinge body 25. The hinge body 25 includes a plurality of hinge units and a compensation mechanism 253. The plurality of hinge units are connected to the compensation mechanism 253. The plurality of hinge units can rotate relatively to achieve bending or unfolding of the hinge body 25, such that the compensation mechanism 23 can perform compensation movement. When the bendable hinge is bent, the flexible member 30 can drive the second frame 23 to slide relative to the bendable assembly 24 or the hinge body 25, reducing a stretching force that the flexible member 20 is subjected to when bending, thereby reducing or avoiding the damage of the flexible member 30.

Alternatively, the bendable assembly 24 can be a bendable hinge. The bendable hinge may include a plurality of hinge units, or may include a plurality of hinge units and at least one connecting member located on one side of the plurality of hinge units, or may include a plurality of hinge units and a compensation mechanism located on at least one side of the plurality of hinge units. Alternatively, the connecting member can be regarded as a hinge unit. Alternatively, the compensation mechanism can also be regarded as a hinge unit. Alternatively, the bendable hinge may include a plurality of hinge units. The outermost hinge unit of the plurality of hinge units may include a connecting member or a compensation mechanism. The first frame 21 and the bendable hinge are rigidly connected, and the second frame 23 and the bendable hinge are elastically connected.

Figure 6:
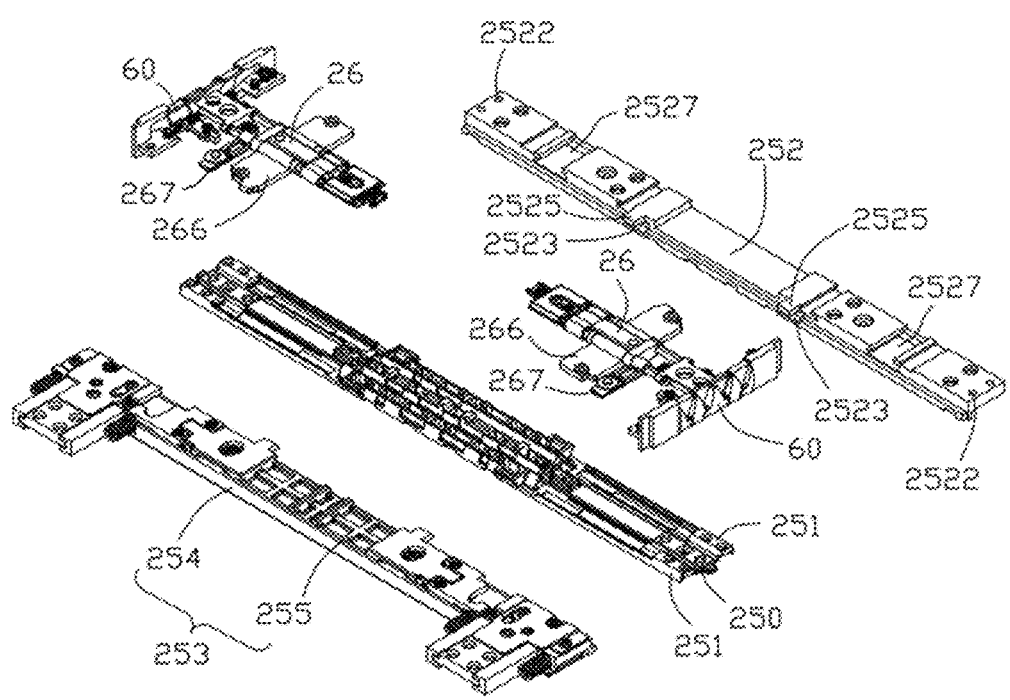
FIG. 6 is an exploded schematic view of a partial three-dimensional structure of the bendable assembly in FIG. 5.
Figure 7:
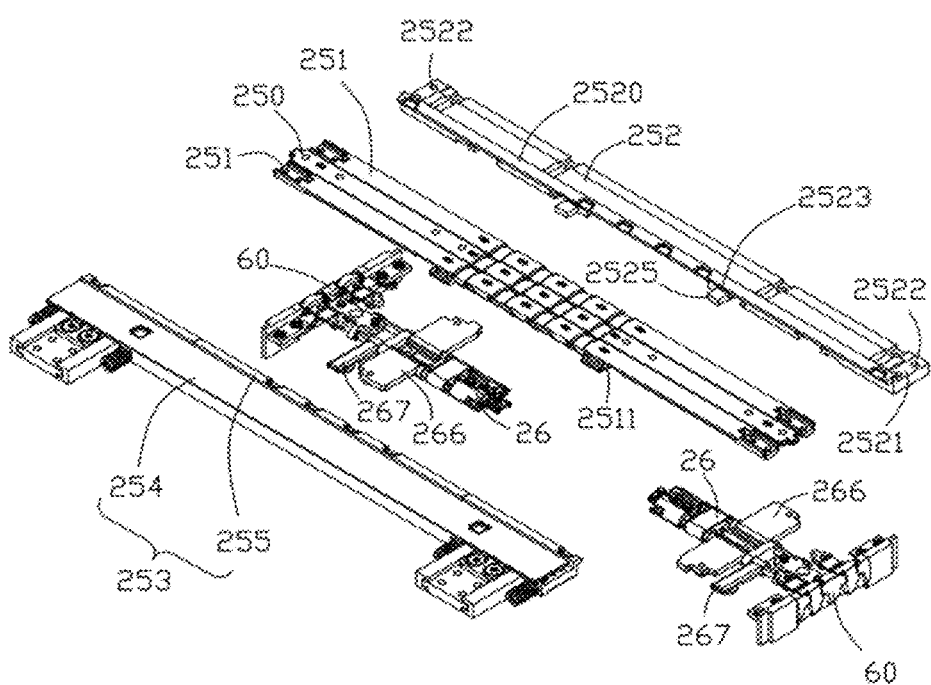
FIG. 7 is a schematic perspective view of the bendable assembly of FIG. 6 from another perspective.

As shown in FIGS. 6 and 7, the plurality of hinge units include a central hinge 250 located in a middle, two supporting hinges 251 rotatably connected to opposite sides of the central hinge 250, and a connecting hinge 252 rotatably connected to one side of one supporting hinge 251 away from the central hinge 250, and a compensation mechanism 253 rotatably connected to one side of the other supporting hinge 251 away from the central hinge 250. In this embodiment, the supporting member 50 covers a front surface of the compensation mechanism 253, a front surface of the hinge body 25, and a front surface of the first frame 21. The flexible member 30 is a flexible screen, and a back surface of the flexible screen is attached to a front surface of the supporting member 50 and a front surface of the second frame 23. The flexible screen may be a flexible display screen or a flexible touch screen, or a combination of both. The same ends of the central hinge 250, the two supporting hinges 251, the connecting hinge 252 and the compensation mechanism 253 are rotatably connected to one body through the hinge mechanism 60, that is, opposite sides of the central hinge 250 are rotatably connected to the two supporting hinges 251, one side of one supporting hinge 251 away from the central hinge 250 is rotatably connected to the connecting hinge 252, and one side of the other supporting hinge 251 away from the central hinge 250 is rotatably connected to the compensation mechanism 253. In this embodiment, the central hinge 250 and each supporting hinge 251 are connected by a rotary shaft; one supporting hinge 251 and the connecting hinge 252 are also connected by a rotary shaft, and the other supporting hinge 251 and the compensation mechanism 253 are also connected by a rotary shaft.

The rotating mechanism 26 is located on the central hinge 250. The rotating mechanism 26 includes two first linking members 266 disposed on opposite sides thereof. The compensation mechanism 253 includes a sliding member and a connecting member 255 slidably connected to the sliding member along a direction perpendicular to a bending axis of the hinge body 25. One end of the first linking member 266 away from the central hinge 250 is slidably connected to or abuts against the connecting member 255, and the first linking member 266 can drive the connecting member 255 to rotate. One end of the other first linking member 266 away from the central hinge 250 is slidably connected to or abuts against the connecting hinge 252. The connecting hinge 252 and the compensation mechanism 253 both rotate relative to the central hinge 250, so as to drive the corresponding first linking member 266 and the corresponding supporting hinge 251 to rotate, which causes the hinge body 25 to be bent or unfolded, so as to achieve a bending or an unfolding of the flexible member 30. Alternatively, the sliding member includes a mounting frame 254, and the connecting member 255 is slidably connected to the mounting frame 254. The second frame 23 and the sliding member are slidably connected in parallel to the first frame 21 or the bendable hinge. The sliding member can be slidably arranged on the connecting member.

When the connecting hinge 252 and the compensation mechanism 253 rotate toward one side away from a light emitting surface of the flexible member 30, the corresponding first linking member 266 and the corresponding supporting hinge 251 are caused to rotate towards one side away from the light emitting surface of the flexible member 30, and the bendable assembly 24 is thus bent, thereby the bendable region 31 of the flexible member 30 is realized to be bent. When the connecting hinge 252 and the compensation mechanism 253 rotate towards the light emitting surface of the flexible member 30, the corresponding first linking member 266 and the corresponding supporting hinge 251 are caused to rotate towards the light emitting surface of the flexible member 30, and the bendable assembly 24 is thus unfolded, thereby the bendable region 31 of the flexible member 30 is realized to be unfolded.

In this embodiment, the number of the rotating mechanisms 26 is two. The two rotating mechanisms 26 are respectively disposed at opposite ends of the hinge body 25. The number of the central hinge 250 is one. The number of the supporting hinges 251 are two. The number of the connecting hinge 252 and the compensation mechanism 253 are both one. The supporting member 50 is a steel sheet, liquid metal sheet, plastic sheet or other elastic sheet that is attached to a back surface of the flexible member 30. The front surface refers to a surface that coincides with the light emitting surface of the flexible member 30, and the back surface refers to a surface away from the light emitting surface.

In this embodiment, the electronic device 100 is, for example, but not limited to a mobile phone, a tablet computer, a display, a liquid crystal panel, an OLED panel, a TV, a smart watch, a VR head-mounted display, a car display or any other product and component with a display function.

The bendable assembly 24 of the electronic device 100 of the present disclosure includes a hinge body 25, at least one rotating mechanism 26 located on the hinge body 25, and a compensation mechanism 253 located on one side of the hinge body 25. The opposite sides of the central hinge 250 of the hinge body 25 are rotatably connected to the supporting hinge 251. One side of the supporting hinge 251 away from the central hinge 250 is rotatably connected to the connecting hinge 252, and one side of the other supporting hinge 251 away from the central hinge 250 is rotatably connected to the compensation mechanism 253, and the first linking members 266 on opposite sides of the rotating mechanism 26 are slidably connected to or abutted against the connecting hinge 252 and the compensation mechanism 253, respectively. When the two first linking members 266 of the rotating mechanism 26 rotate towards one side by following the connecting hinge 252 and compensation mechanism 253 respectively, the two supporting hinges 251 also rotate to the same side, so as to bend and unfold the bendable assembly 24, so that the bendable assembly 24 can adapt to the bending requirements of the flexible member 30. In addition, the compensation mechanism 253 is only disposed on one side of the hinge body 25, and the compensation mechanism 253 is configured as one of the hinge units of the hinge body 25, so that the compensation mechanism 253 occupies less stacking space of the whole machine, which is beneficial to expand the internal space of the whole machine and can accommodate a larger capacity battery, other electronic components with larger sizes or more electronic components, and can further save the plurality of components of the compensation mechanism 253, reducing manufacturing costs.

In this embodiment, the supporting member 50 is a thin steel sheet that can be bent. Preferably, the supporting member 50 is a liquid metal sheet. The reason why the liquid metal sheet is selected as the supporting member 50 is that the liquid metal sheet has better abrasion resistance.

In other embodiments, the supporting member 50 may also be a soft wear-resistant plastic sheet, a Teflon coating, a soft wear-resistant rubber sheet, a soft silicone sheet, or so on.

Figure 2:
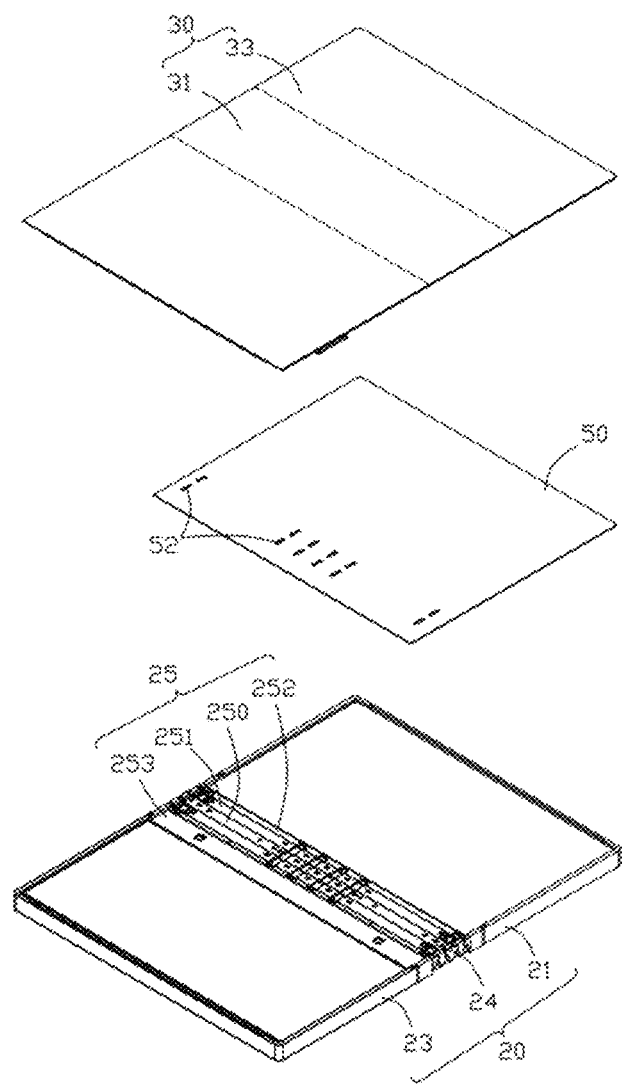
FIG. 2 is a perspective exploded view of a flexible member, a housing, and a supporting member of the electronic device in FIG. 1.
Figure 3:
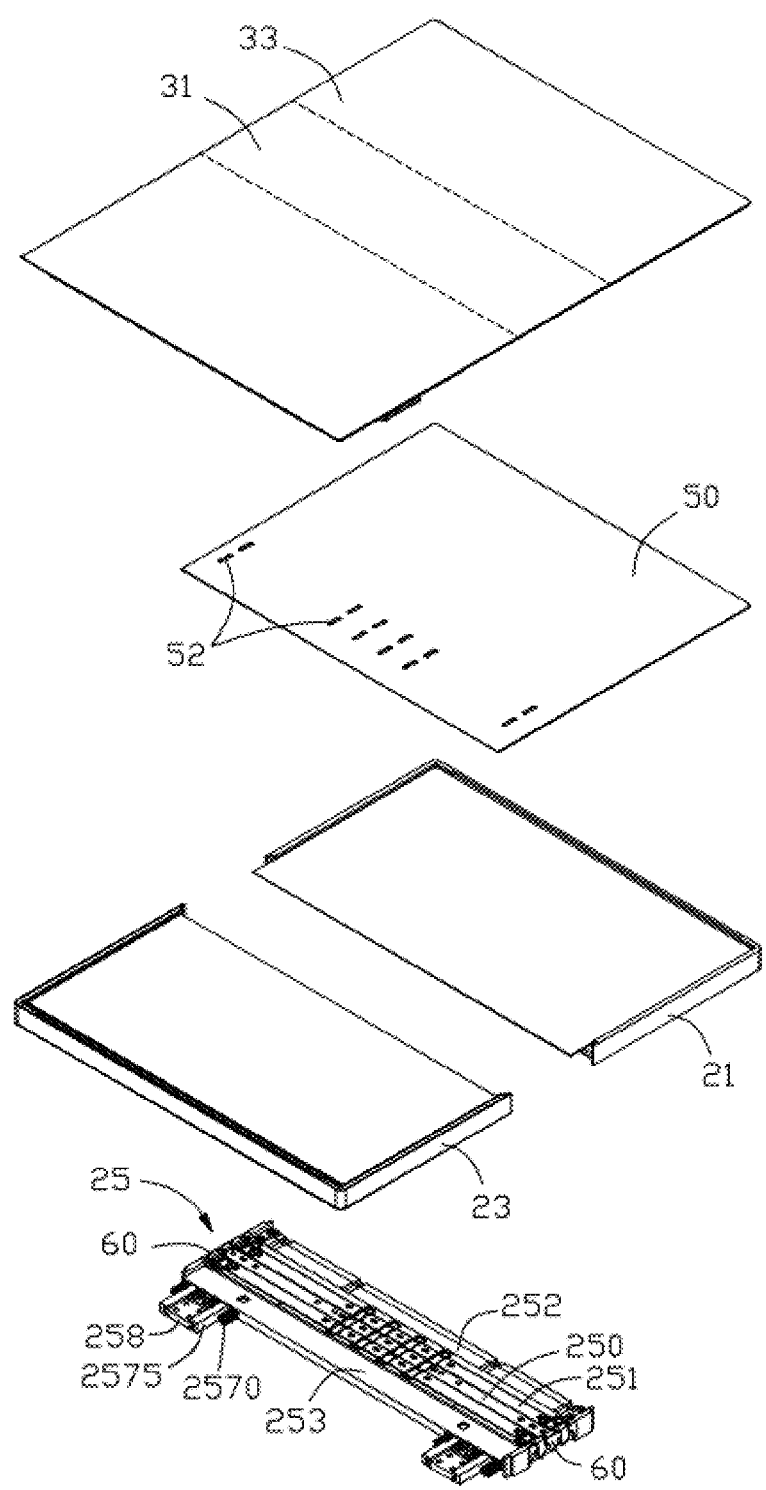
FIG. 3 is a further exploded schematic view of the electronic device in FIG. 2.
Figure 4:
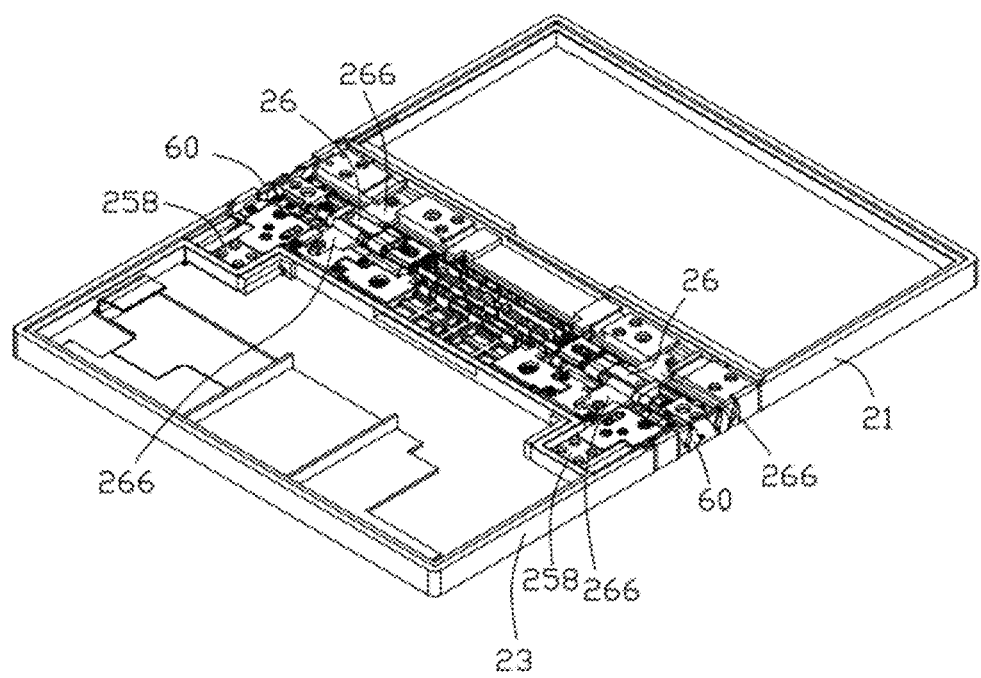
FIG. 4 is a schematic perspective view of the electronic device in FIG. 1 from another perspective.

As shown in FIGS. 2 and 3, the supporting member 50 defines a plurality of connecting grooves 52 corresponding to the front surface of the hinge body 25. Each connecting groove 52 cuts through the front surface and the back surface of the supporting member 50. The plurality of connecting grooves 52 are configured to fill colloid between the hinge body 25 and the supporting member 50. The colloid is configured to slidably connect the flexible member 30 and the supporting member 50. In this embodiment, one side of the supporting member 50 facing the hinge body 25 defines two rows of spaced connecting grooves 52 along the bending axis of the hinge body 25, that is, each row of the connecting grooves 52 extends along the bending axis of the hinge body 25. Each connecting groove 52 is a strip-shaped hole, and each connecting groove 52 extends along a direction perpendicular to the bending axis of the hinge body 25.

Figure 5:
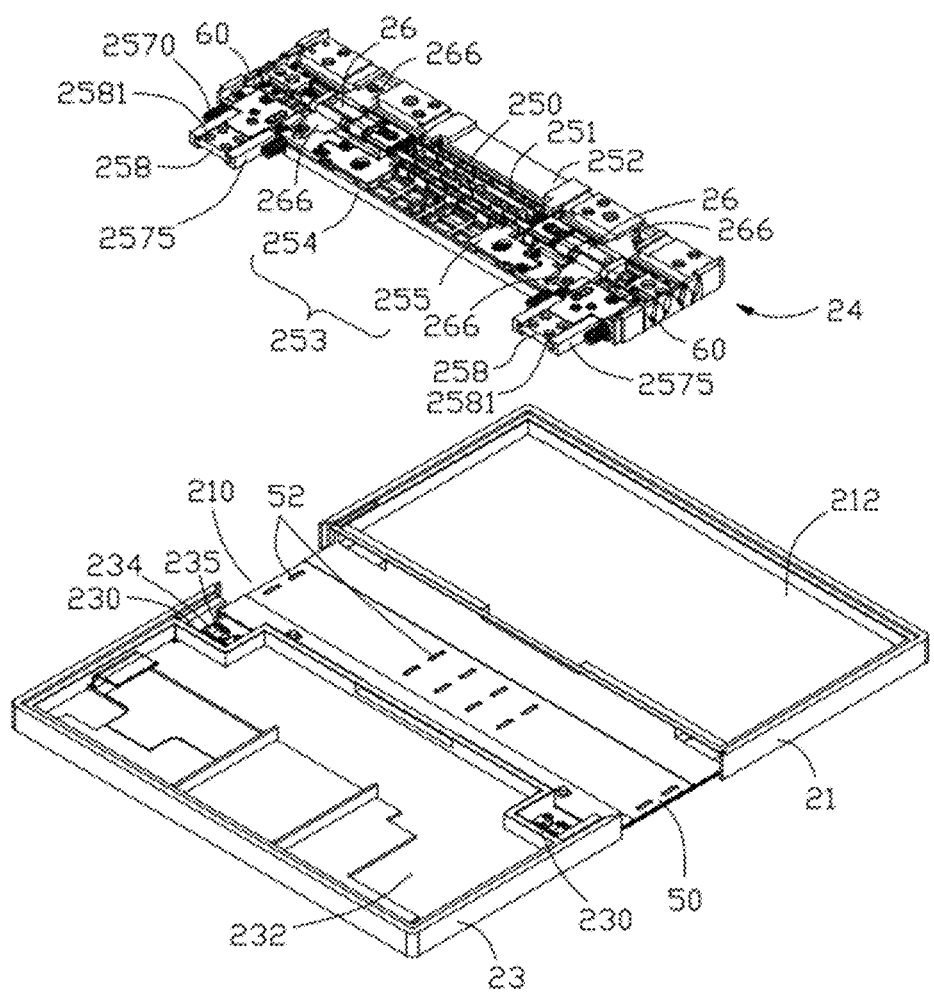
FIG. 5 is an exploded schematic view of the three-dimensional structure of the housing and a bendable assembly of the electronic device in FIG. 4.

As shown in FIG. 5, the first frame 21 and the second frame 23 cooperatively form a receiving slot 210 for receiving the hinge body 25. The first frame 21 defines a rectangular first receiving space 212. The first receiving space 212 is configured for receiving batteries and other components. The two opposite ends of one side of the second frame 23 close to the receiving slot 210 are respectively provided with a connecting member 230. One side of the connecting member 230 facing the receiving slot 210 interconnects with the receiving slot 210. One edge of the second frame 23 and the connecting member 230 cooperatively form a second receiving space 232 having a "凸" shape. The second receiving space 232 is configured to install electronic components such as circuit boards. The second frame 23 includes a plurality of mounting bars 234 in each connecting member 230. Each mounting bar 234 defines a mounting hole 235. Because the bendable assembly 24 of the present disclosure includes one compensation mechanism 253 on only one side, and the compensation mechanism 253 is connected to the two connecting members 230 of the second frame 23, therefore, there is no need to provide a connecting member in the first frame 21, which can expand the receiving space of the first receiving space 212 of the first frame 21, so as to increase the battery space, which facilitates the installation of large-capacity battery, and increases the battery life of the electronic device 100.

Figure 8:
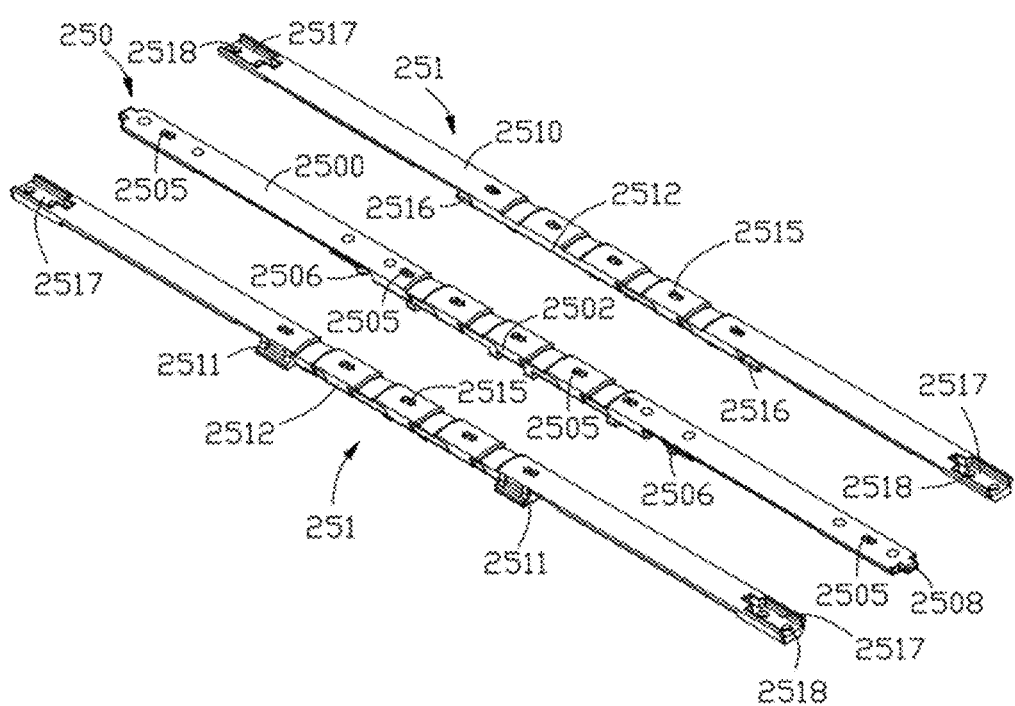
FIG. 8 is an exploded schematic view of the three-dimensional structure of a central hinge and a supporting hinge of the bendable assembly in FIG. 7.
Figure 9:
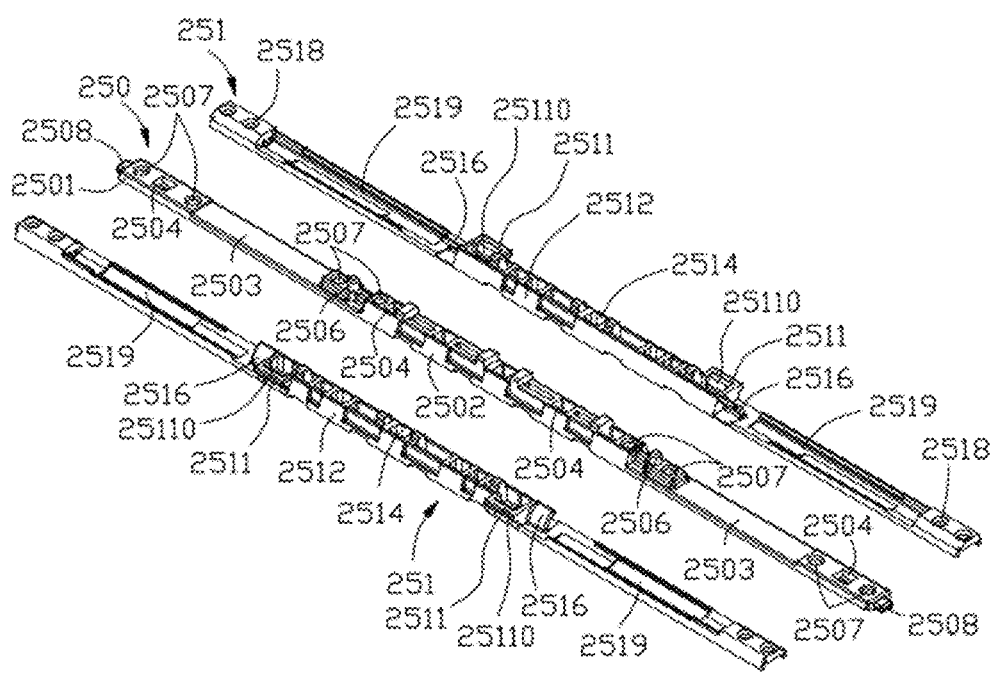
FIG. 9 is a schematic diagram of another perspective of the central hinge and supporting hinge in FIG. 8.
Figure 10:
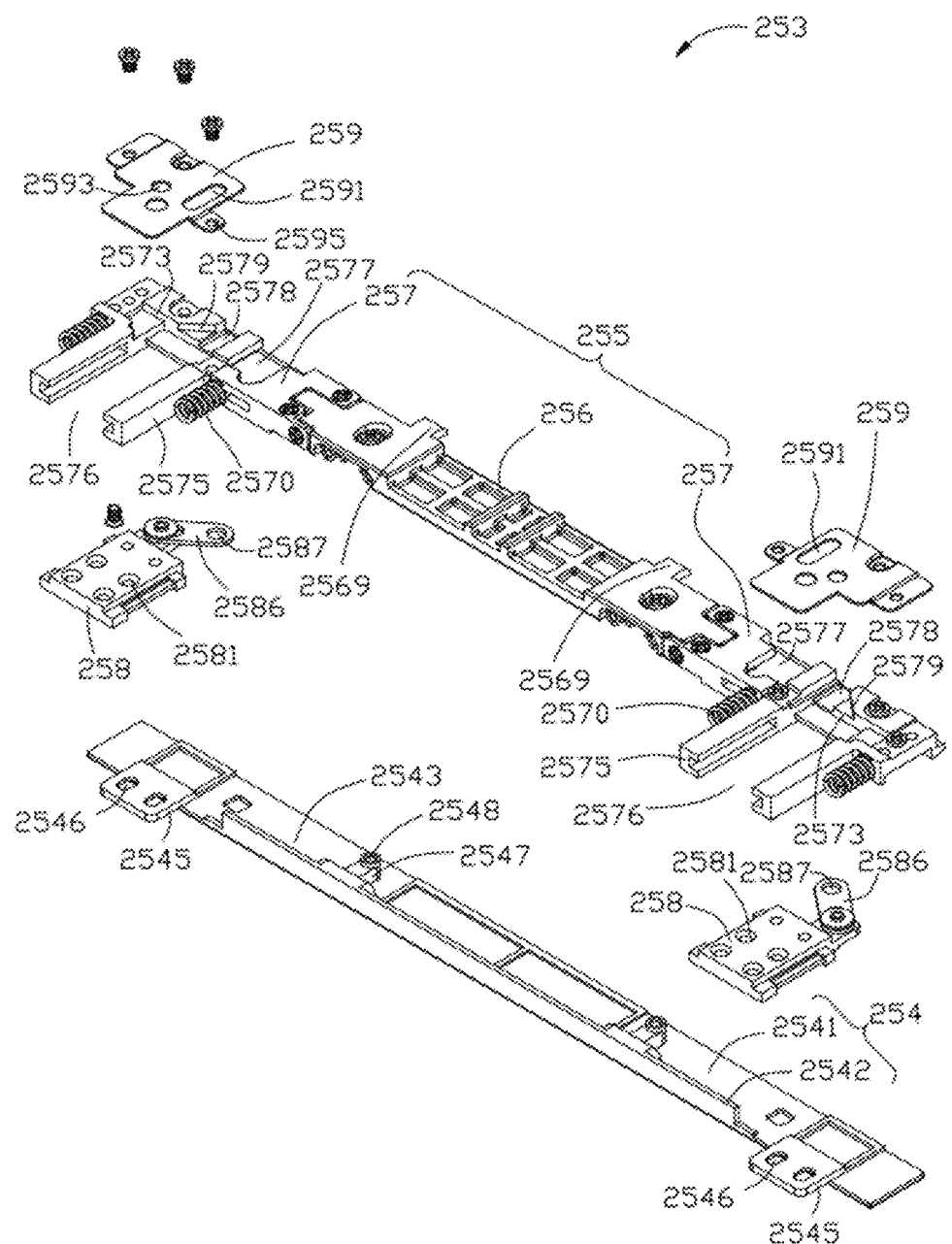
FIG. 10 is an exploded schematic view of the three-dimensional structure of the compensation mechanism of the bendable assembly in FIG. 6.
Figure 11:
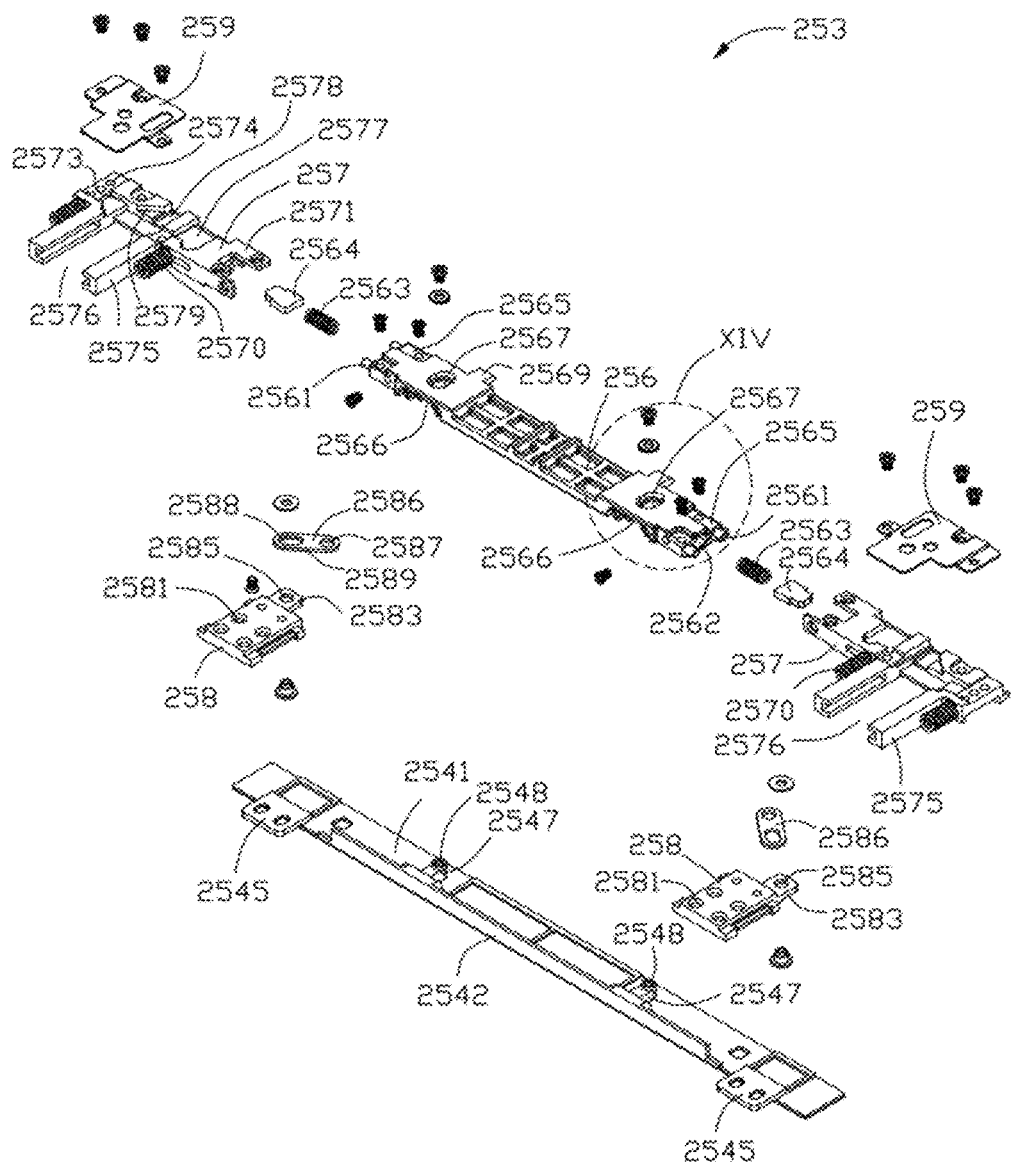
FIG. 11 is a further exploded schematic view of the compensation mechanism of FIG. 10.
Figure 12:
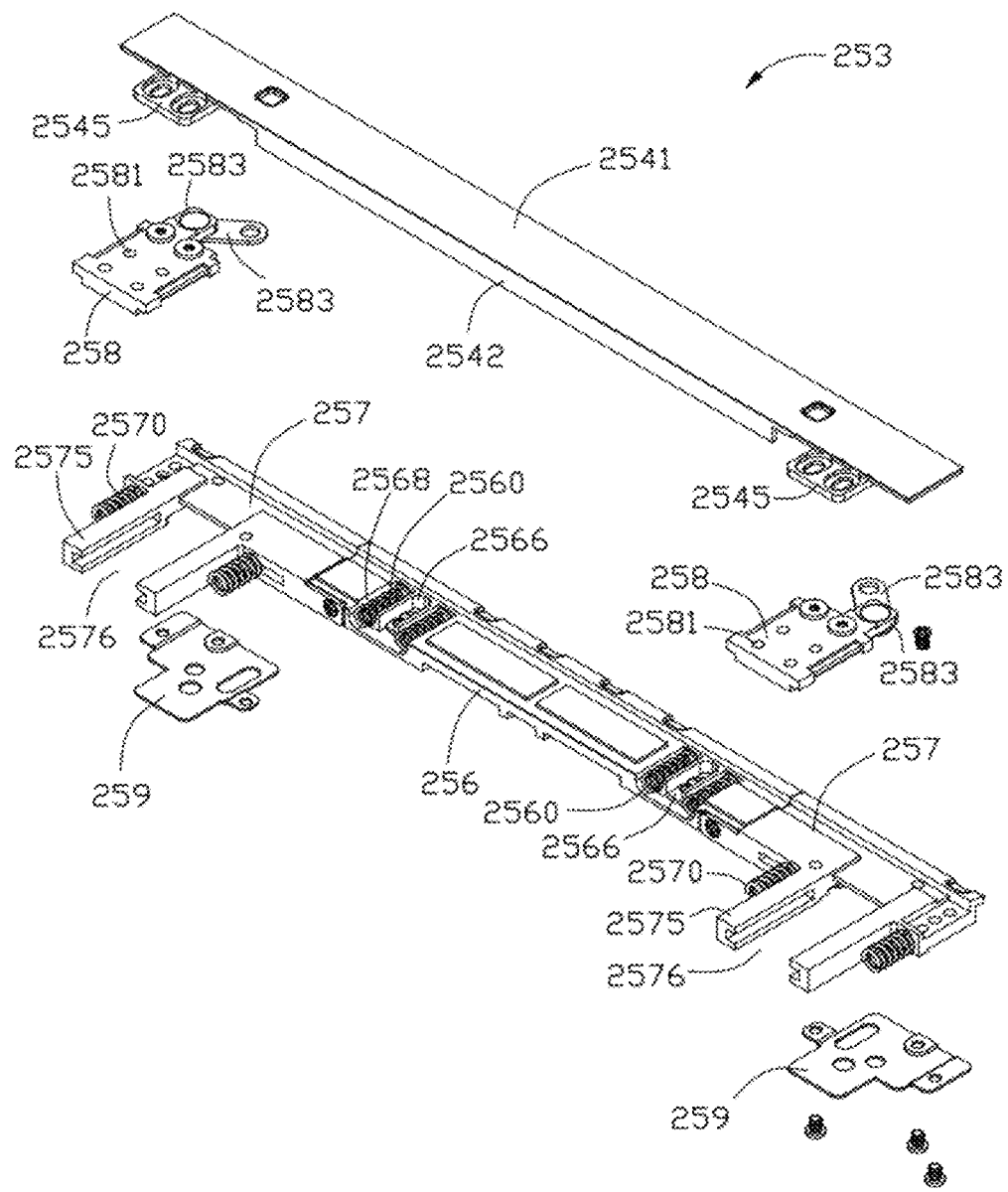
FIG. 12 is a schematic diagram of another perspective of the compensation mechanism in FIG. 10.
Figure 13:
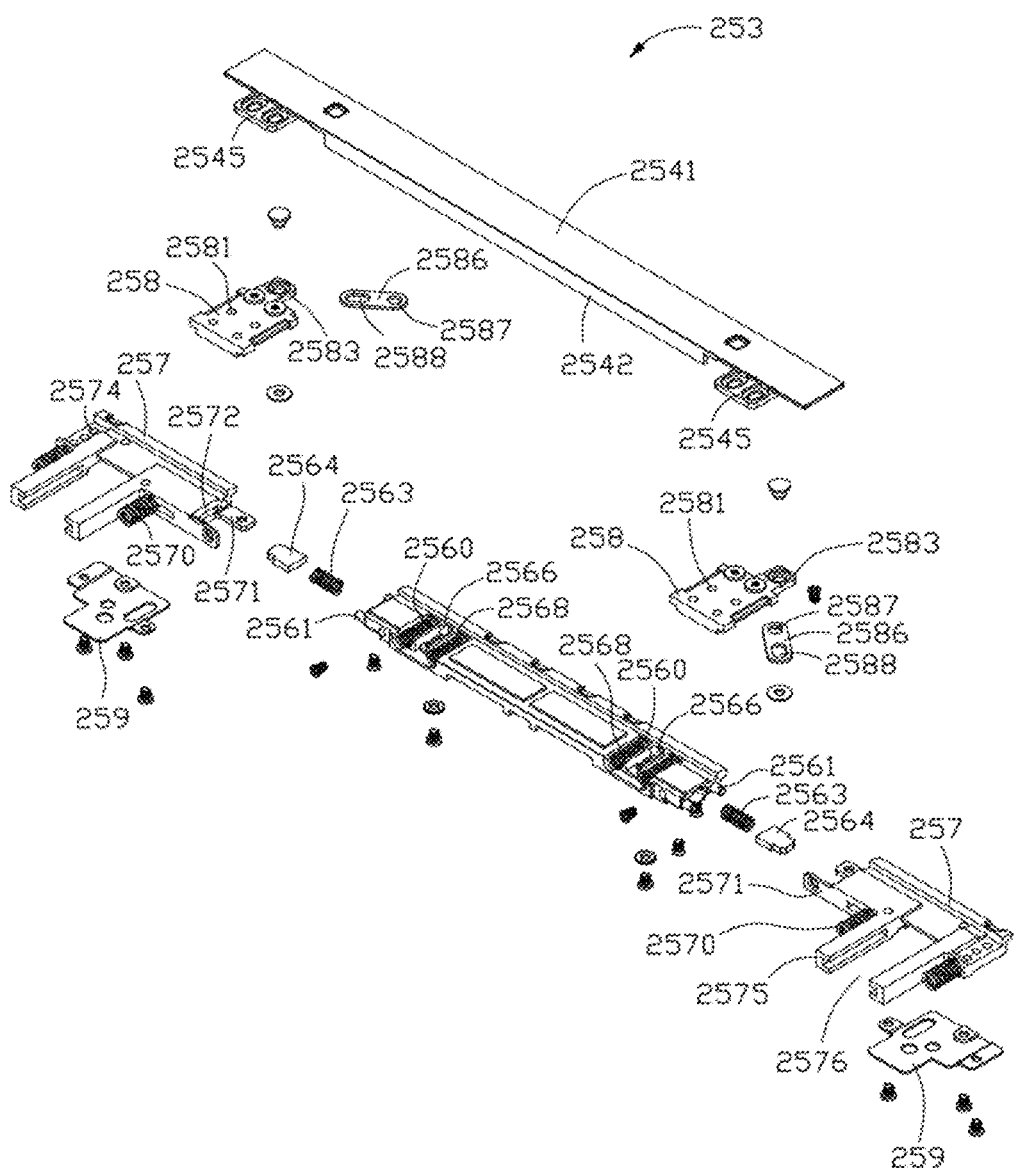
FIG. 13 is a further exploded schematic view of the compensation mechanism of FIG. 12.
Figure 14:
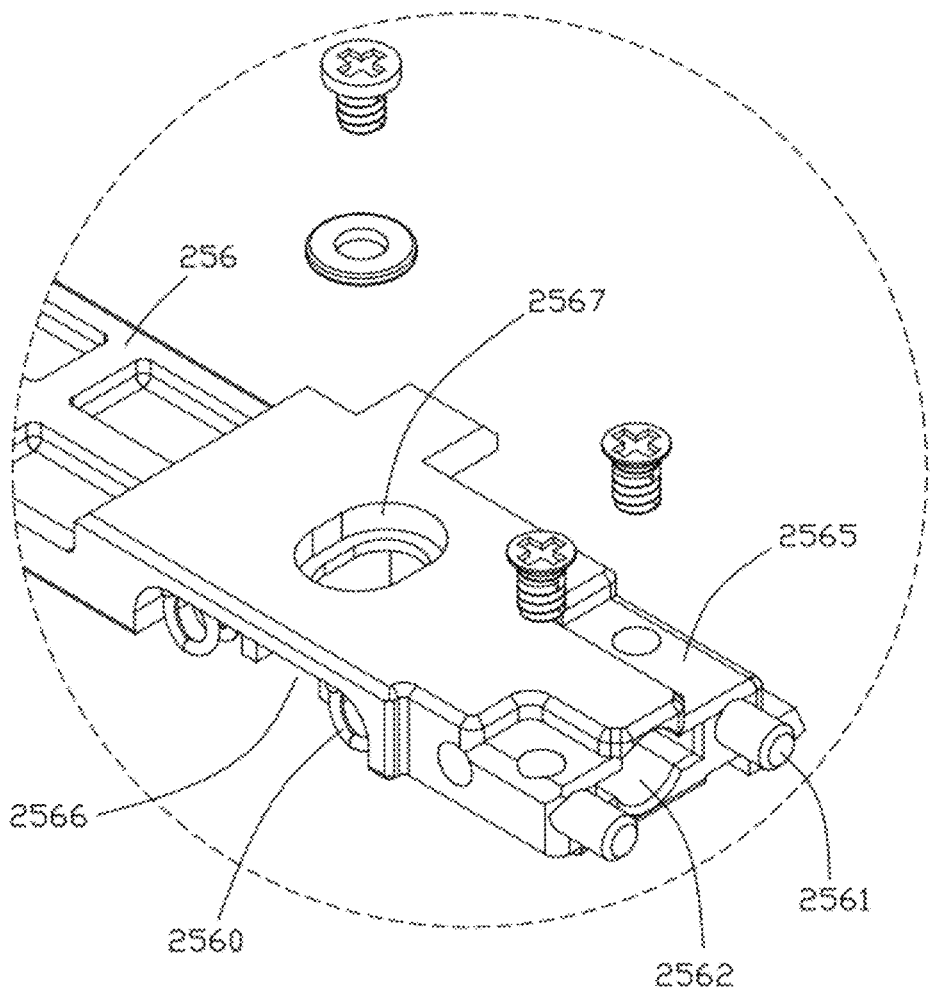
FIG. 14 is an enlarged view of the XIV portion in FIG. 11.
Figure 15:
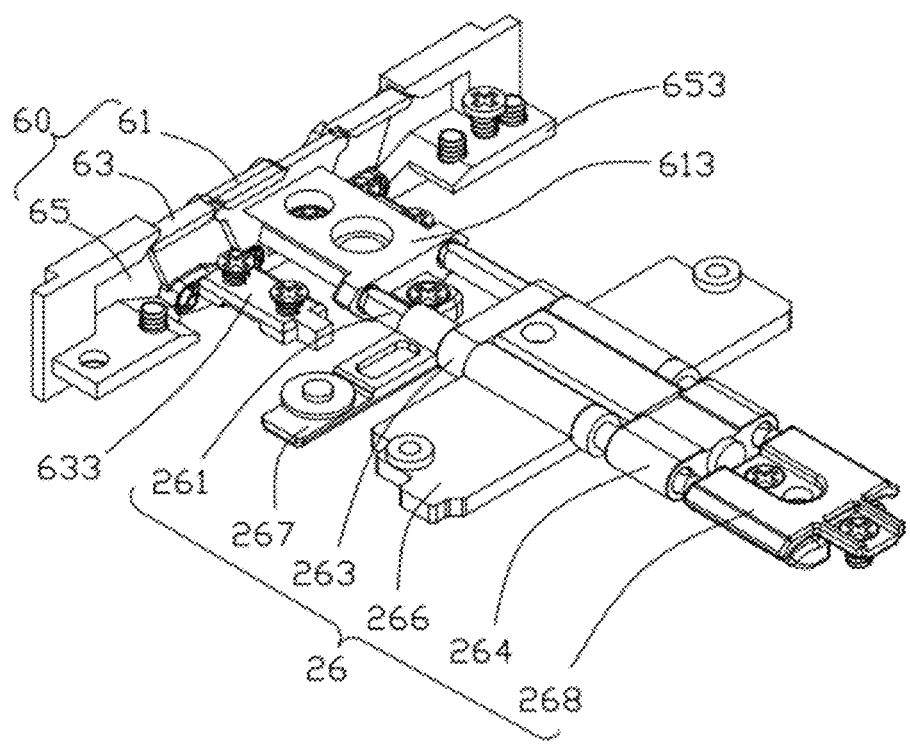
FIG. 15 is a schematic perspective view of the rotating mechanism of the bendable assembly of FIG. 6.
Figure 16:
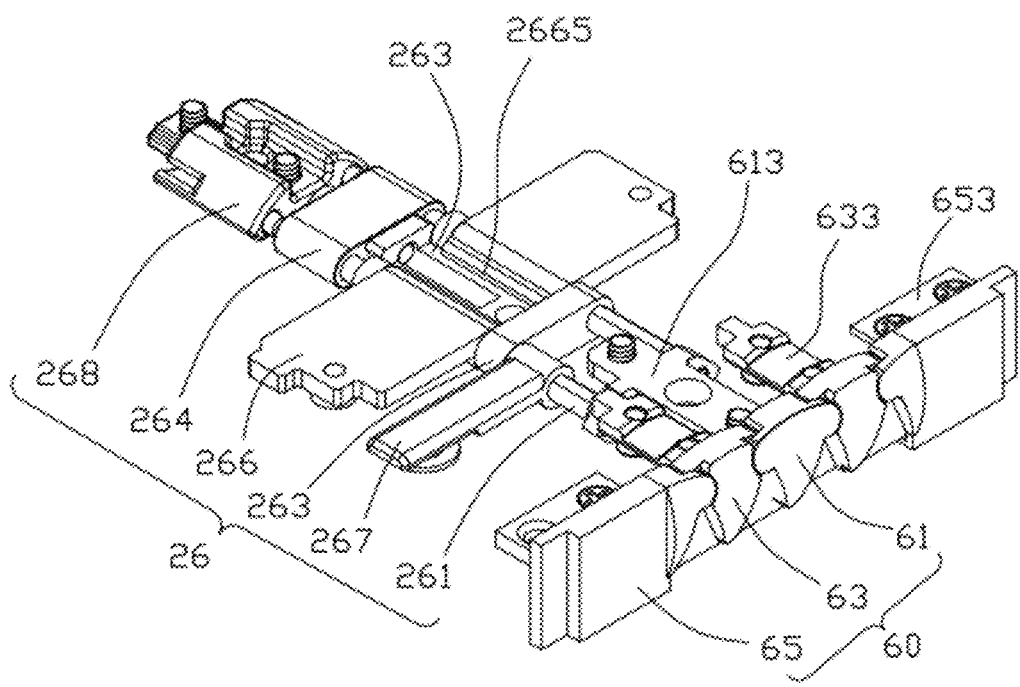
FIG. 16 is a schematic perspective view of the rotating mechanism in FIG. 15 from another perspective.
Figure 17:
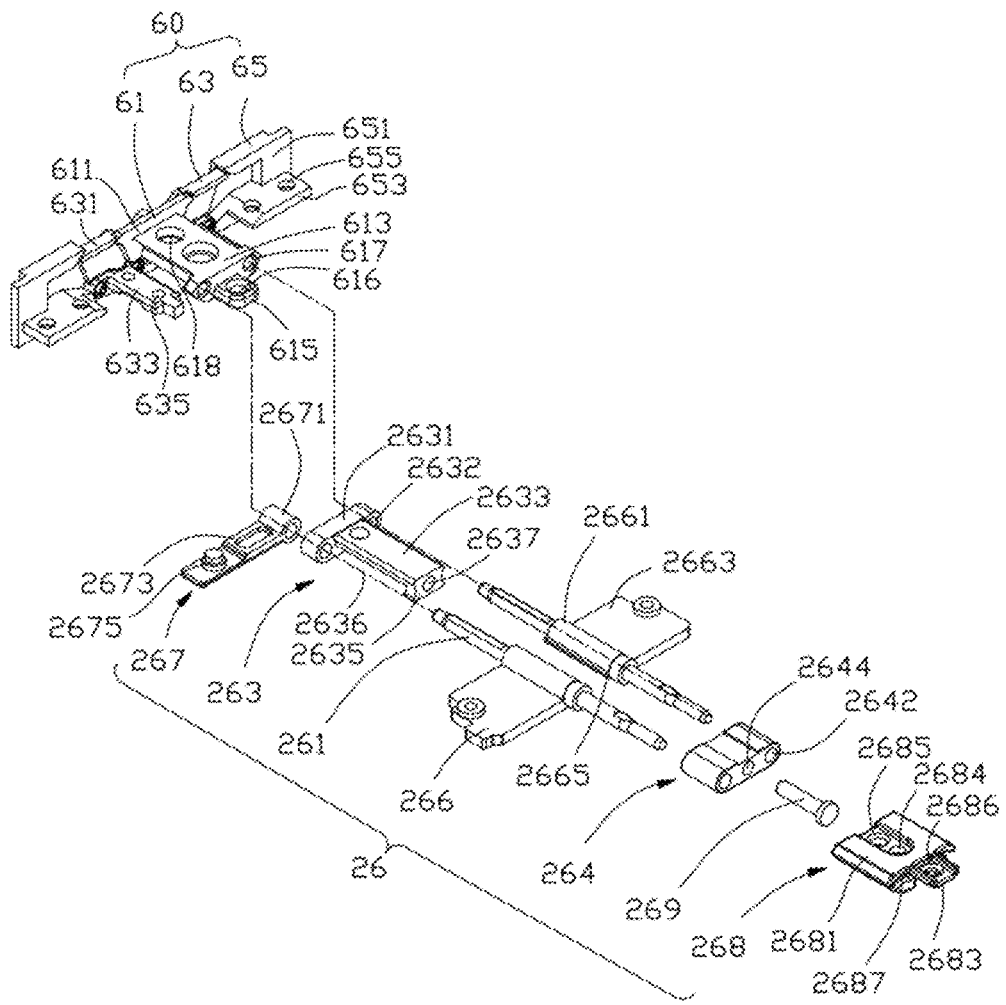
FIG. 17 is an exploded schematic view of the three-dimensional structure of the rotating mechanism in FIG. 15.

Please referring to FIG. 8 and FIG. 9 together, the central hinge 250 is in a shape of a bar, which includes a fixing bar 2501. The fixing bar 2501 includes a front surface 2500 having an arc-shaped cross section and a back surface away from the front surface 2500. A dispensing portion 2502 is disposed on a middle of the back surface of the fixing bar 2501. Opposite ends of the back surface of the fixing bar 2501 are provided with two mounting portions 2503 respectively. The two mounting portions 2503 are configured to install the two rotating mechanisms 26. The central hinge 250 defines a plurality of dispensing holes. The plurality of dispensing holes are arranged at intervals along a lengthwise direction of the dispensing portion 2502. Each dispensing hole includes a dispensing port 2504 on a back surface of the dispensing portion 2502 and a connecting port 2505 on the front surface 2500 of the dispensing portion 2502 and interconnects with the dispensing port 2504. The dispensing port 2504 of each dispensing hole is a square port, a round port, a polygonal port, etc., and the connecting port 2505 of each dispensing hole is a bar port, a waist port, or an oval port, etc. In this embodiment, there are five dispensing holes formed on the dispensing portion 2502, the dispensing port 2504 of each dispensing hole is a square port, the connecting port 2505 of the dispensing hole is a bar-shaped port, and each connecting port 2505 extends along the lengthwise direction of the central hinge 250. When the whole machine is bent, the supporting member 50 slides relative to the hinge body 25, so that the colloid is stretched to maintain the state of pulling the supporting member 50.

Each mounting portion 2503 includes a positioning post 2506 protruding from the back surface of the fixing bar 2501 and close to the dispensing portion 2502. The back surface of the central hinge 250 defines fixing holes 2507 on opposite sides of the positioning post 2506 respectively. The two opposite ends of the back surface of the central hinge 250 each defines with two fixing holes 2507 separated from each other. Two opposite ends of the back surface of the central hinge 250 define dispensing holes respectively. Preferably, the dispensing hole is located between the corresponding two fixing holes 2507; the opposite ends of the central hinge 250 each is provided with one clamping block 2508.

Each supporting hinge 251 has a bar shape. The supporting hinge 251 includes a front surface 2510 having a circular cross section and a back surface away from the front surface 2510. The supporting hinge 251 defines a plurality of dispensing holes. The plurality of dispensing holes are arranged at intervals along a lengthwise direction of the supporting hinge 251. Each dispensing hole cuts through the front surface 2510 and the back surface of the supporting hinge 251. The colloid is filled from the back surface of the supporting hinge 251 to the dispensing hole and then adhered to a back surface of the supporting member 50. Specifically, a dispensing portion 2512 is disposed on a middle of the supporting hinge 251, and the dispensing portion 2512 extends along the lengthwise direction of the supporting hinge 251. A plurality of dispensing holes are defined in the dispensing portion 2512, and the plurality of the dispensing holes are arranged at intervals along the lengthwise direction of the dispensing portion 2512. Each dispensing hole includes a dispensing port 2514 located on the back surface of the dispensing portion 2512 and a connecting port 2515 located on the front surface 2510 of the dispensing portion 2512 and interconnecting with the dispensing port 2514. The dispensing port 2514 of each dispensing hole is a square port, a circular port, a polygonal port, etc., and the connecting port 2515 of each dispensing hole is a bar-shaped port, a waist port, or an oval port, etc.; in this embodiment, there are five dispensing holes formed on the dispensing portion 2512. The dispensing port 2514 of each dispensing hole is a square port. The connecting port 2515 of each dispensing hole is a bar-shaped port. Each connecting port 2515 extends along the lengthwise direction of the central hinge 250.

The back surface of each supporting hinge 251 is provided with arc-shaped guide slides 2516 at opposite ends of the dispensing portion 2512. Each guide slide 2516 is bent toward the central hinge 250. An axis of the guide slide 2516 and a rotation axis between the supporting hinge 251 and the central hinge 250 coincide. One side of each supporting hinge 251 away from the central hinge 250 is provided with two protrusions 2511 on the opposite ends of the dispensing portion 2512, respectively, and a back surface of each protrusion 2511 defines an avoidance hole 25110. Each supporting hinge 251 defines two clamping groove 2517 on two opposite sides of the front surface 2510. The supporting hinge 251 defines fixing holes 2518 on a bottom surface of each clamping groove 2517. The back surface of each supporting hinge 251 defines a receiving slot 2519 between each clamping groove 2517 and the guide slide 2516. The receiving slot 2519 is configured to receive a part of the hinge mechanism 60.

As shown in FIGS. 6 and 7, the connecting hinge 252 has a strip shape. The connecting hinge 252 includes a front surface 2520 and a back surface away from the front surface 2520. Two opposite ends of the front surface 2520 of the connecting hinge 252 each defines a clamping groove 2521. A bottom surface of each clamping groove 2521 defines fixing holes 2522. One side surface of the connecting hinge 252 facing the supporting hinge 251 defines two plug hole 2523 corresponding to the two protrusions 2511 of the supporting hinge 251. The back surface of the connecting hinge 252 is provided with extending blocks 2525 each close to one plug hole 2523. The connecting hinge 252 defines two first guide grooves 2527 corresponding to the two first linking members 266 on the same side of the two rotating mechanisms 26.

Please referring to FIG. 10 to FIG. 14 together, the mounting frame 254 of the compensation mechanism 253 includes a strip-shaped mounting plate 2541 and an abutting piece 2542 disposed on one side of the mounting plate 2541 away from the central hinge 250. The mounting plate 2541 and the abutting piece 2542 cooperatively form a receiving space 2543. The connecting member 255 is slidably received in the receiving space 2543. The abutting piece 2542 is configured for preventing the connecting member 255 from disengaging from the mounting frame 254. The opposite ends of the mounting plate 2541 are respectively provided with connecting pieces 2545. The abutting piece 2542 and the two connecting pieces 2545 are located on the same side of the mounting plate 2541, and each connecting piece 2545 extends outward in a direction perpendicular to the lengthwise direction of the mounting plate 2541. Each connecting piece 2545 defines strip-shaped connecting hole 2546s, and each connecting hole 2546 extends in a direction perpendicular to the lengthwise direction of the mounting plate 2541. The connecting member 255 and the mounting frame 254 are connected through the guide groove engaging with the corresponding guiding bar, and the guide groove and the guiding bar extend in a direction perpendicular to the lengthwise direction of the mounting plate 2541, that is, at least one guide groove is defined between the connecting member 255 and the mounting frame 254, and at least one guiding bar each is slidably engaged with one guide groove. In this embodiment, the mounting frame 254 is provided with two guiding bars 2547 spaced apart from each other in the accommodating space 2543, and each guiding bar 2547 extends along a direction perpendicular to the lengthwise direction of the mounting plate 2541, and a connecting hole 2548 is defined at one end of each guiding bar 2547. The connecting member 255 includes a fixing member 256 located in a middle thereof and two connecting members 257 located at opposite ends of the fixing member 256. The two connecting members 257 are respectively connected to the opposite ends of the fixing member 256 so as to form the connecting member 255 in a bar shape. The two opposite ends of the fixing member 256 are respectively provided with two connecting posts 2561. Each end surface of the fixing member 256 defines a mounting hole 2562 between the two connecting posts 2561. The mounting hole 2562 is provided with an elastic member 2563 and an abutting block 2564. One end of the abutting block 2564 abuts one end of the elastic member 2563, and the other end of the abutting block 2564 exposes the end surface of the fixing member 256. In this embodiment, the elastic member 2563 is a spring. Two opposite ends of the back surface of the fixing member 256 respectively define two positioning grooves 2565 separated from each other, and the fixing member 256 defines positioning holes on the bottom surface of each positioning groove 2565. In this embodiment, one side of the fixing member 256 facing the mounting frame 254 defines two guide grooves 2566 corresponding to the two guiding bars 2547 of the mounting frame 254. The guide groove 2566 extends perpendicular to the lengthwise direction of the connecting member 255. Each guiding bar 2547 is slidably inserted in the guide groove 2566. A strip-shaped hole 2567 is defined on the back surface of the fixing member 256 and interconnected with the guide groove 2566. The strip-shaped hole 2567 extends along the lengthwise direction of the guide groove 2566. When the guiding bar 2547 is inserted into the guide groove 2566, the strip-shaped hole 2567 faces the connecting hole 2548 of the guiding bar 2547.

The connecting member 255 and the sliding member are elastically connected through a first elastic member. Specifically, a plurality of first elastic members 2560 are provided between the connecting member 255 and the mounting frame 254, and the plurality of first elastic members 2560 elastically resist between the connecting member 255 and the mounting frame 254. The connecting member 255 defines two receiving slots 2568. Alternatively, each receiving slot 2568 has a first slot for receiving the sliding member and a second slot for receiving the first elastic member 2560. Alternatively, the first slot is interconnected with the second slot. Alternatively, the first slot cuts through the side surface of the connecting member, and the second slot cuts through the side surface of the connecting member. The connecting member may further be provided with second elastic members 2570, which are located outside the receiving slot 2568. Alternatively, the second elastic member 2570 is located below the first slot of the receiving slot 2568. Alternatively, the number of the second slots of the receiving slot 2568 of the connecting member may be multiple, and the plurality of the first elastic members 2560 are respectively inserted into the second slots of the receiving slots 2568. After the connecting member 255 is assembled with the mounting frame 254, one end of each first elastic member 2560 abuts the abutting piece 2542 of the mounting frame 254, and the other end of each first elastic member 2560 abuts the side surface of the receiving slot of the connecting member 255 opposite to the abutting piece. In this embodiment, the first elastic member 2560 is a spring. Alternatively, the receiving slot further includes a third slot defined between two adjacent second slots. Alternatively, the third slot includes the guide groove 2566. The front surface of the fixing member 256 respectively defines the second grooves of the receiving slot 2568 on opposite sides of each guide groove 2566. Each receiving slot 2568 receives one first elastic member 2560. One end of the first elastic member 2560 abuts the end surface of the receiving slot 2568, and the other end extends beyond the side surface of the fixing member 256. Of course, the other end of the first elastic member 2560 need not extend beyond the side surface of the fixing member 256, but can be accommodated within the range of the side surface of the fixing member 256. Two opposite ends of one side of the fixing member 256 away from the mounting frame 254 are respectively protruded with extending blocks 2569, and the side surface of the fixing member 256 away from the first elastic member 2560 defines inserting holes close to the two extending blocks 2569 respectively.

Each connecting member 257 includes a connecting piece 2571 close to one end of the fixing member 256. A through hole is defined in the connecting piece 2571. The end surface of each connecting member 257 facing the fixing member 256 defines a positioning groove 2572 and two engaging holes at opposite ends of the positioning groove 2572. Each connecting member 257 defines an engaging groove at one end away from the fixing member 256, and the connecting member 257 defines a plurality of fixing holes 2574 on a bottom surface of each engaging groove. One end of one side of the connecting member 257 extends a lug 2575 vertically outward. The lug 2575 defines a sliding groove 2576 for accommodating the sliding part along its extending direction. Each connecting member 257 defines a first guide groove 2527 corresponding to the first linking member 266. The first linking member 266 is slidably inserted into the first guide groove 2527. One side of each connecting member 257 away from the lug 2575 defines a second guide groove 2578 interconnected to the sliding groove 2576. The connecting member 257 includes a first positioning surface 2579 between the second guide groove 2578 and the corresponding sliding groove 2576. The first positioning surface 2579 extends along the lengthwise direction of the connecting member 257 or the sliding direction of the sliding part. The connecting member 257 further includes a second positioning surface 2573 connected to the first positioning surface 2579 between the second guide groove 2578 and the corresponding slide groove 2576. The second positioning surface 2573 is parallel to the longitudinal direction of the connecting member 257.

Alternatively, the sliding part includes a sliding plate 258, and the sliding part is located between the second frame 23 and the bendable hinge. The sliding part is embedded in the second frame 23. The sliding member and the sliding part are stacked in a thickness direction of the electronic device 100. The sliding member and the sliding part are partially staggered. The sliding member and the sliding part are slidably connected by a locking member. When the bendable hinge is bent, the sliding member can slide relative to the sliding part. A sliding distance of the sliding member relative to the bendable hinge is less than a sliding distance of the second frame 23 or the sliding part relative to the bendable hinge.

The connecting member 255 and the second frame 23 are elastically connected by the second elastic member 2570. A plurality of second elastic members 2570 are provided on one side of the connecting member 255 away from the central hinge 250. One end of each second elastic member 2570 is connected to the connecting member 255, and the other end passes through the mounting frame 254 to abut the second frame 23. Specifically, a plurality of positioning posts are disposed on one side of the connecting member 255 away from the central hinge 250; a plurality of second elastic members 2570 are respectively disposed on the plurality of positioning posts. In this embodiment, each connecting member 257 includes two second elastic members 2570 disposed on two opposite sides of the lug 2575. The second elastic member 2570 is a spring. The connecting member 257 includes a positioning post on one side disposing the lug 2575. One end of the second elastic member 2570 is snapped on the positioning post.

Alternatively, the sliding part includes two sliding plates 258. The two sliding plates 258 are slidably disposed in the sliding grooves 2576 of the two connecting members 257, respectively. A connecting piece 259 is covered on each sliding plate 258. Each sliding plate 258 is a rectangular plate, and a plurality of through holes 2581 are defined in the sliding plate 258. A protruding piece 2583 is protruded from one end surface of the sliding plate 258, and a connecting hole 2585 is defined in the protruding piece 2583. The protruding piece 2583 is movably connected to a strip-shaped positioning piece 2586. One end of the positioning piece 2586 defines a rotating hole 2587, and the opposite end of the positioning piece 2586 defines a strip-shaped groove 2588 extending along its length. The opposite ends of the positioning piece 2586 are respectively provided with rounded surfaces, and the opposite sides of the positioning piece 2586 are side surfaces 2589 parallel to each other. The connecting piece 259 is configured to be fixedly connected to the connecting member 255 and covers the sliding plate 258. A guide groove 2591 is defined along the sliding direction of the sliding plate 258 on the connecting piece 259. A receiving hole 2593 is defined in a middle of the connecting piece 259, and a plurality of through holes 259 are defined around the connecting piece 2595.

Please referring to FIG. 15 to FIG. 18 together, each rotating mechanism 26 includes two parallel connecting shafts 261, two first linking members 266 sleeved in the middle of the two connecting shafts 261 respectively, and a first positioning member 263 and a second positioning member 264 sleeved on the two connecting shafts 261 respectively, a second linking member 267 sleeved on one of the connecting shafts 261, a connecting member 268 and a locking member 269 disposed at one end of the two connecting shafts 261. Each first linking member 266 includes a sleeve 2661 sleeved in the middle of the connecting shaft 261 and a linking rod 2663 provided on an outer circumferential surface of the sleeve 2661. The linking rod 2663 extends in a radial direction of the sleeve 2661. The sleeve 2661 can be rotatably connected to the connecting shaft 261 or fixedly connected to the connecting shaft 261. One side of the outer circumferential surface of the sleeve 2661 away from the connecting rod 2663 is provided with an anti-reverse fold bar 2665 that extends in the axial direction of the connecting shaft 261. The first positioning member 263 includes a positioning plate 2631, an extension plate 2633 disposed at a middle of one side of the positioning plate 2631, and a connection piece 2635 disposed at one end of the extension plate 2633 away from the positioning plate 2631. The positioning plate 2631, the extension plate 2633 and the connection piece 2635 cooperatively form a positioning space 2636; the opposite ends of the positioning plate 2631 are rounded. The positioning plate 2631 defines shaft holes 2632 along the axial direction of the connecting shaft 261 on opposite sides of the extension plate 2633 respectively, and a connecting hole 2637 is defined in the middle of the connecting piece 2635. The second positioning member 264 is a waist-shaped block, that is, the opposite ends of the second positioning member 264 are processed with arcs. The second positioning member 264 defines two shaft holes 2642 and a connecting hole 2644 along the axial direction of the connecting shaft 261. The two shafts holes 2642 are located on opposite sides of the second positioning member 264, and the connecting hole 2644 is located between the two shaft holes 2642. The second linking member 267 includes a sleeve 2671 sleeved on the connecting shaft 261, a linking rod 2673 disposed on the outer circumferential surface of the sleeve 2671, and a connecting post 2675 disposed on an end of the linking rod 2673 away from the sleeve 2671. The sleeve 2671 can be rotatably connected to the connecting shaft 261 or fixedly connected to the connecting shaft 261. The linking rod 2673 extends in the radial direction of the sleeve 2671, and the connecting post 2675 extends in a direction perpendicular to the lengthwise direction of the linking rod 2673. The extending direction of the connecting post 2675 may be the thickness direction of the linking rod 2673. The connecting member 268 includes a substantially rectangular connecting block 2681 and a connecting piece 2683 provided at one end of the connecting block 2681. An engaging hole 2684 and a through hole 2685 are defined on one side of the connecting block 2681 away from the connecting piece 2683, and a through hole 2686 is defined on the connecting piece 2683. The end surface of the connecting block 2681 close to the connecting piece 2683 defines arc-shaped guide grooves 2687 on opposite sides of the connecting piece 2683 respectively. The guide grooves 2687 are the same as the corresponding circular arc of the guide slide 2516, that is, the guide slide 2516 can slide into the corresponding guide groove 2687. Two opposite sides of the connecting block 2681 away from the end surface of the connecting piece 2683 define connecting holes 2688 respectively.

The hinge mechanism 60 includes a first hinge 61, two second hinges 63 rotatably connected to opposite sides of the first hinge 61, and two third hinges 65 each rotatably connected to one side of each second hinge 63 away from the first hinge 61. The first hinge 61 includes a first blocking piece 611 and a connecting bar 613 protruding from one side of the first blocking piece 611. The connecting bar 613 is provided with a connecting piece 615 at an end away from the first blocking piece 611, and the connecting piece 615 defines a through hole 616. One end of the connecting bar 613 away from the first blocking piece 611 defines shaft holes 617 on opposite sides of the connecting plate 615 respectively, and the connecting bar 613 defines a through hole 618 close to the first blocking piece 611. Each second hinge member 63 includes a second blocking piece 631 rotatably connected between the first hinge 61 and the third hinge 65, and a connecting bar 633 protruding from one side of the second blocking piece 631. The connecting bar 633 defines a through hole 635. Each third hinge member 65 includes a third blocking piece 651 rotatably connected to the corresponding second blocking piece 631 on a side away from the first hinge 61, and a connecting piece 653 protruding on one side of the third blocking piece 651. The connecting piece 653 defines a through hole 655.

When assembling each rotating mechanism 26, the sleeves 2661 of the two first linking members 266 are respectively sleeved on the middle of the two connecting shafts 261; one end of the two connecting shafts 261 are inserted into the shaft holes 2632 of the first positioning member 263 respectively. The sleeves 2661 of the two first linking members 266 are received in the positioning spaces 2636 of the first positioning member 263. The second positioning member 264 is sleeved on the ends of the two connecting shafts 261 away from the first positioning member 263 until the second positioning member 264 abuts against the connecting piece 2635 of the first positioning member 263, at this time, the connecting hole 2644 of the second positioning member 264 is directly facing the connecting hole 2637 on the connecting piece 2635, and the sleeve 2661 of each first linking member 266 is clamped between the positioning plate 2631 of the first positioning member 263 and the second positioning member 264. The locking member 269 is inserted into the connecting hole 2644 of the second positioning member 264 and locked into the connecting hole 2637 of the connecting piece 2635. The sleeve 2671 of the second linking member 267 is sleeved on one end of the connecting shaft 261 close to the first positioning member 263. The ends of the two connecting shafts 261 close to the second linking member 267 are inserted into the two shaft holes 617 of the first hinge 61. The connecting member 268 is sleeved on one end of the two connecting shafts 261 close to the second positioning member 264. At this time, the first linking member 266 and the second linking member 267 are connected to the corresponding connecting shafts 261 respectively. When the first linking member 266 rotates to the unfolding state, the anti-reverse fold bar 2665 of the first linking member 266 abuts against the first positioning member 263 to prevent the first linking member 266 from further rotating.

Understandably, a linkage device may be further disposed on the two connecting shafts 261, so as to drive the two connecting shafts 261 to rotate synchronously, preferably to drive the two connecting shafts 261 to rotate synchronously and reversely. The linkage device may include gears fixedly sleeved on each connecting shaft 261, one gear of each connecting shaft 261 meshes with the other gear of the other connecting shaft 261. When one of the connecting shafts 261 rotates, it drives its gear to rotate, the rotation of the gear drives the other gear to rotate in the reverse direction, which in turn drives the other connecting shaft 261 to rotate in the reverse direction, which has a linkage effect. Of course, the linkage device is not limited to gears, but can also be other types of linkage structures, for example, a bump is formed on each connecting shaft 261, and a sliding block that can slide along the axial direction of the connecting shaft 261 is provided between the two connecting shafts 261. The sliding block defines two sliding grooves extending obliquely along the axial direction of the connecting shaft 261. Each bump is set in the corresponding sliding groove. When one connecting shaft 261 rotates, the bump slides in the sliding groove and drives the sliding block to slide. Then, the bump of the other connecting shaft 261 is driven to slide, so that the other connecting shaft 261 rotates synchronously. It should be understood, the present disclosure is not limited to the above two types of linkage devices, as long as the structure can drive the two connecting shafts to rotate synchronously.

Please referring to FIG. 6 to FIG. 7 and FIG. 10 to FIG. 14 together, when assembling the compensation mechanism 253, the two connecting members 257 are respectively connected to opposite ends of the fixing member 256, so that the connecting pieces 2571 of each connecting member 257 are inserted into the corresponding positioning grooves 2565 of the fixing member 256, the connecting posts 2561 at both ends of the fixing member 256 are inserted into the corresponding engaging holes, and the two abutting blocks 2564 are inserted into the positioning grooves 2572 of the two connecting members 257, respectively. A plurality of locking members pass through the through holes on the connecting piece 2571 and are locked in the positioning holes on the bottom surface of the corresponding positioning groove 2565. The mounting frame 254 is mounted with the connecting member 255 so that the two guiding bars 2547 of the mounting frame 254 are slidably inserted into the two guide grooves of the connecting member 255. A plurality of first elastic members 256 are elastically clamped between the connecting member 255 and the abutting piece 2542 of the mounting frame 254. A plurality of second elastic members 2570 are exposed outside the abutting piece 2542. The two locking members pass through the two strip-shaped holes 2567 of the fixing member 256 and are locked in the connecting holes 2548 of the corresponding guiding bars 2547 respectively. The locking member can slide along the lengthwise direction of the strip-shaped hole 2567 in the strip-shaped hole 2567. The inner wall of the strip-shaped hole 2567 is formed with a convex ring-shaped stepper, and a spacer is sleeved on the locking member, a diameter of the spacer is larger than a width of an elongated slot surrounded by the ring-shaped stepper, and the spacer is accommodated in the strip-shaped hole 2567 and slides against the top surface of the stepper. The locking member and the spacer are configured to pull the mounting frame 254 and the connecting member 255 in a thickness direction to prevent them from detaching. The mounting frame 254 can slide along the strip-shaped hole 2567 relative to the connecting member 255. A plurality of locking members respectively pass through the connecting holes 2546 of the connecting pieces 2545 of the mounting frame 254 and are fixed on the sliding plate 258. The locking member can slide along the lengthwise direction of the connecting hole 2546 following the sliding plate 258. The two positioning pieces 2586 are connected to the two sliding plates 258 respectively. The strip-shaped groove 2588 of each positioning piece 2586 faces the connecting hole 2585 of the corresponding sliding plate 258. The two connecting members are inserted into the connecting holes 2585 of the two sliding plates 258 and corresponding strip-shaped grooves 2588. The two sliding plates 258 are slidably inserted into the sliding grooves 2576 of the two connecting members 257 respectively, and the two positioning pieces 2586 are placed in the spaces formed by the sliding grooves 2576 and the second guide grooves 2578, respectively.

Please referring to FIGS. 6-22 together, when assembling the bendable assembly 24, the two rotating mechanisms 26 are installed on the central hinge 250. Specifically, the two rotating mechanisms 26 are placed on the two mounting portions 2503 of the central hinge 250 respectively, so that the positioning post 2506 of each mounting portion 2503 is engaged with the engaging hole 2684 of the connecting member 268 of the corresponding rotating mechanism 26; the clamping blocks 2508 at opposite ends of the central hinge 250 are snapped to the first hinges 61 of the two hinge mechanism 60, respectively; the through hole 2685 of the connecting block 2681, the through hole 2686 of the connecting piece 2683, the through hole 618 of the connecting bar 613 and the through hole 616 of the connecting piece 615 respectively face the fixing holes 2507 of the central hinge 250; several locking members are inserted into the through holes 2685, 2686, 618 and 616 respectively and are locked in the corresponding fixing holes 2507 to install two rotating mechanisms 26 and two hinge mechanisms 60 at opposite ends of the central hinge 250.

The two supporting hinges 251 are placed on opposite sides of the central hinge 250 respectively, so that the two sliding guides 2516 of each supporting hinge 251 can be slidably inserted into the guide grooves 2687 corresponding to the two rotating mechanisms 26. The two opposite ends of each supporting hinge 251 are respectively connected to the second hinges 63 corresponding to the two hinge mechanisms 60, that is, the connecting bars 633 of the second hinge members 63 of each hinge mechanism 60 are inserted into the corresponding clamping grooves 2517 of the corresponding supporting hinge 251; the through hole 635 of each connecting bar 633 faces the fixing hole 2518 corresponding to the supporting hinge 251, and a plurality of locking members are inserted into the through hole 635 and locked in the corresponding fixing hole 2518, so that the two supporting hinge 251 are rotatably connected to the two hinge mechanisms 60 relative to the central hinge 26 between. At this time, the guide slide 2516 of each supporting hinge 251 is slidably inserted into the corresponding guide groove 2687.

The connecting hinge 252 is placed on one side of the second linking member 267 away from the supporting hinge 251. The two first linking members 266 on the same side are slidably inserted into the two first guide grooves 2527 of the connecting hinge 252, respectively. The two projections 2511 of the supporting hinge 251 are respectively facing the two inserting holes 2523 of the connecting hinge 252, the two avoidance holes 25110 of the supporting hinge 251 corresponding to the two extending blocks 2525 of the connecting hinge 252, and the opposite ends of the connecting hinge 252 abuts against the third hinges 65 corresponding to the two hinge mechanisms 60, that is, the connecting pieces 653 of the third hinges 65 on the same side of each hinge mechanism 60 are respectively inserted into the clamping grooves 2521 corresponding to the connecting hinge 252; the through hole 655 of each connecting piece 653 faces the fixing hole 2522 corresponding to the connecting hinge 252, and a plurality of locking members each each is inserted into the through hole 655 and locked in the corresponding fixing hole 2522. At this time, the two projections 2511 of the supporting hinge 251 are slidably inserted into the corresponding two inserting holes 2523, and the two extending blocks 2525 of the connecting hinge 252 are slidably inserted into the corresponding avoidance holes 25110.

The compensation mechanism 253 is placed on one side of the supporting hinge 251 close to the second linking member 267. The two first linking members 266 and the two second linking members 267 on the same side are slidably inserted into the two first guide grooves 2527 and two second guide grooves 2578 of the compensation mechanism 253, respectively. The connecting posts 2675 of each second linking member 267 are rotatably inserted into the corresponding rotating holes 2587, respectively. The abutting block 2564 abuts the side of the first linking member 266 and is configured to apply a damping force to the first linking member 266 under the elastic force of the elastic member 2560. Specifically, the abutting block 2564 abuts the side surface of the first linking member 266 along a sliding direction perpendicular to the first linking member 266. When the bendable assembly 24 is bent, the first linking member 266 slides relative to the connecting member 257 in the axial direction perpendicular to the connecting shaft 261, and the abutting block 2564 elastically resists the first linking member 266 so as to generate a friction force to the first linking member 266. The bendable assembly 24 has a certain damping during the bending process, which improves the bending feel of the whole machine. The two projections 2511 of the supporting hinge 251 are respectively opposite to the two inserting holes of the compensation mechanism 253, the two extending blocks 2569 of the compensation mechanism 253 respectively correspond to the two avoidance holes 25110 of the supporting hinge 251, and the opposite ends of the compensation mechanism 253 abut against the corresponding third hinges 65 of the hinge mechanism 60, that is, the third hinges 65 on the same side of the hinge mechanism 60 are respectively inserted into the clamping grooves corresponding to the compensation mechanism 25, and the through hole 655 of each connecting piece 653 faces the fixing hole 2574 corresponding to the compensation mechanism 253, and a plurality of locking members are inserted into the through holes 655 and locked into the corresponding fixing holes 2574. At this time, the two protrusions 2511 of the supporting hinge 251 are slidably inserted into the two inserting holes corresponding to the compensation mechanism 25, and the two extending blocks 2569 of the compensation mechanism 25 are slidably inserted into the corresponding avoidance holes 25110. The two connecting pieces 259 are covered on the back surface of the two sliding plates 258. The ends of the connecting posts 2675 are slidably received in the guide grooves 2591. The connecting member inserted into the connecting hole 2585 of the sliding plate 258 and the corresponding strip-shaped groove 2588 of the positioning piece 2586 is facing the receiving hole 2593 of the connecting piece 259. A plurality of locking members are respectively connected to the corresponding connecting members 257 through the through holes 2595 of the connecting piece 259. Alternatively, a diameter of the receiving hole 2593 is larger than a diameter of the connecting member inserted into the connecting hole of the sliding plate, so that the connecting member can freely slide within the receiving hole.

Figure 18:
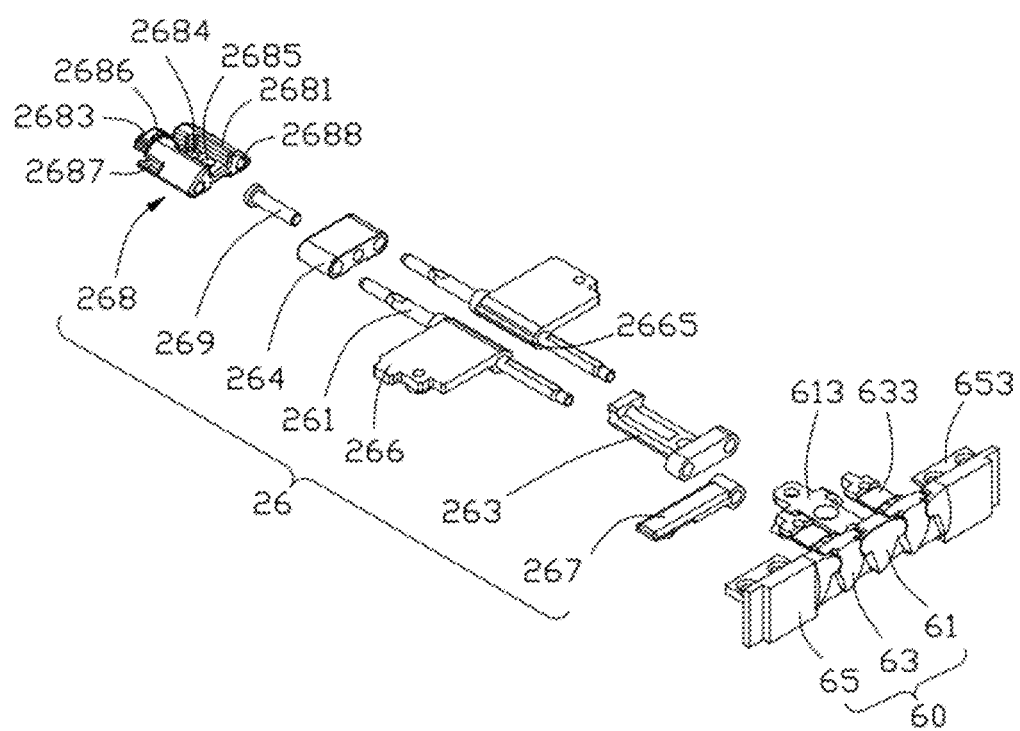
FIG. 18 is an exploded schematic view of the three-dimensional structure of the rotating mechanism in FIG. 16.
Figure 19:
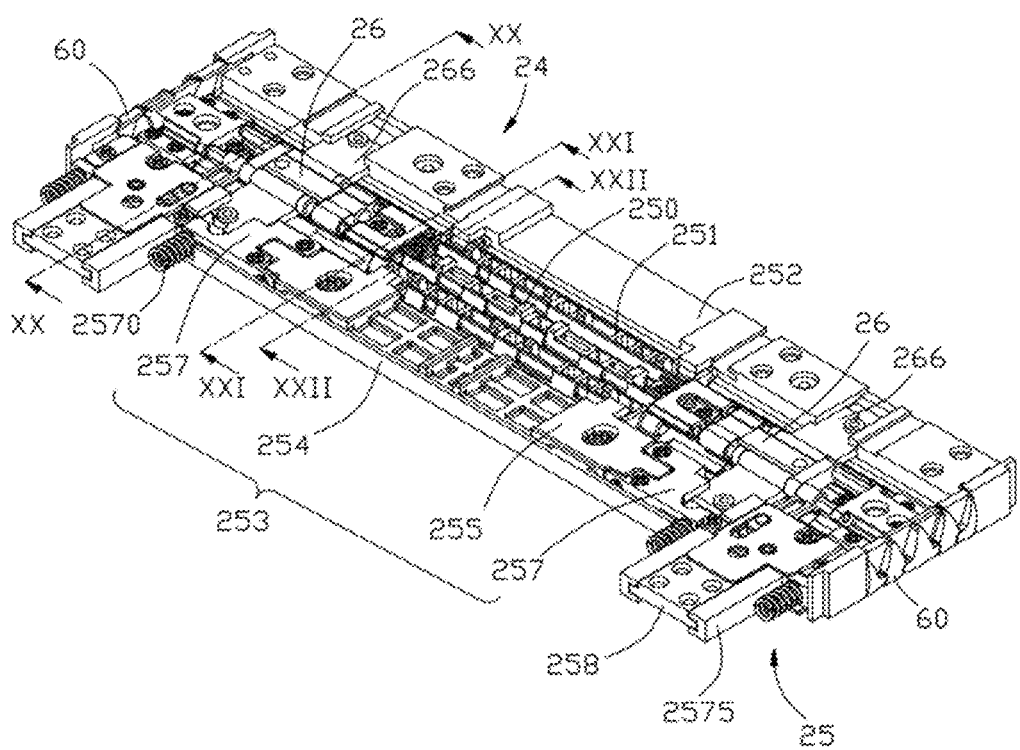
FIG. 19 is an assembled schematic view of the three-dimensional structure of the rotating mechanism in FIG. 6.
Figure 20:
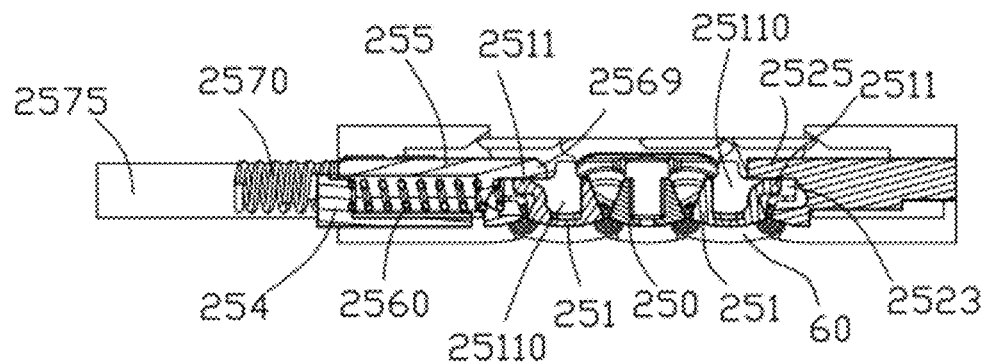
FIG. 20 is a cross-sectional view taken along line XX-XX in FIG. 19.
Figure 21:
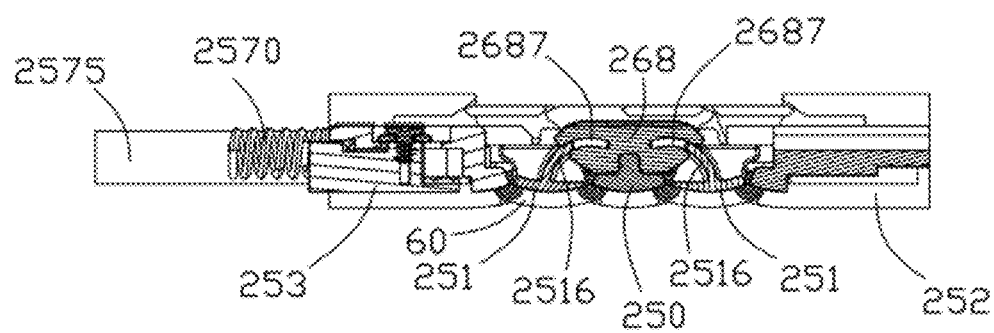
FIG. 21 is a cross-sectional view taken along line XXI-XXI in FIG. 19.
Figure 22:
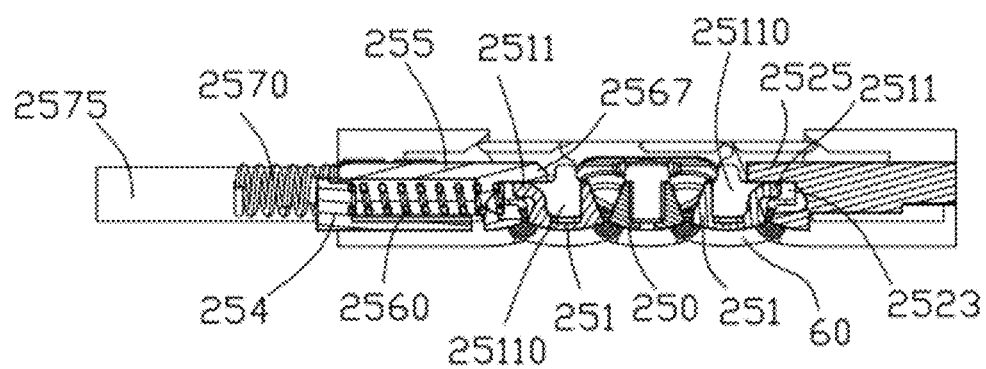
FIG. 22 is a cross-sectional view taken along line XXII-XXII in FIG. 19.
Figure 23:
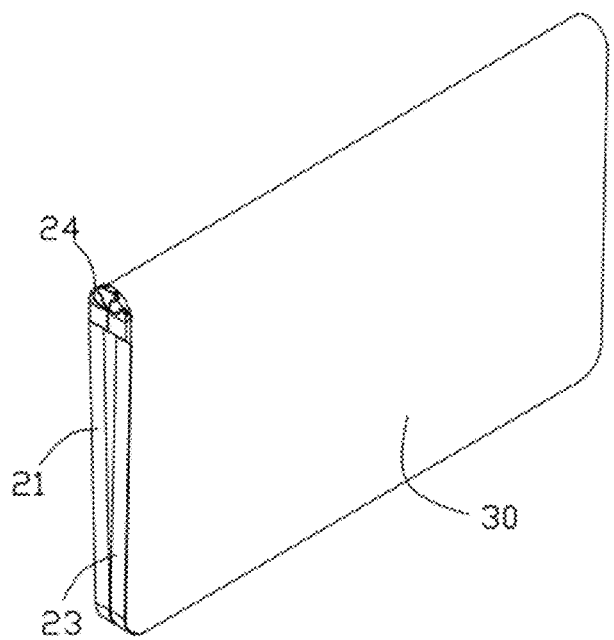
FIG. 23 is a schematic perspective view of the bent state of the bendable assembly of the electronic device in FIG. 1.
Figure 24:
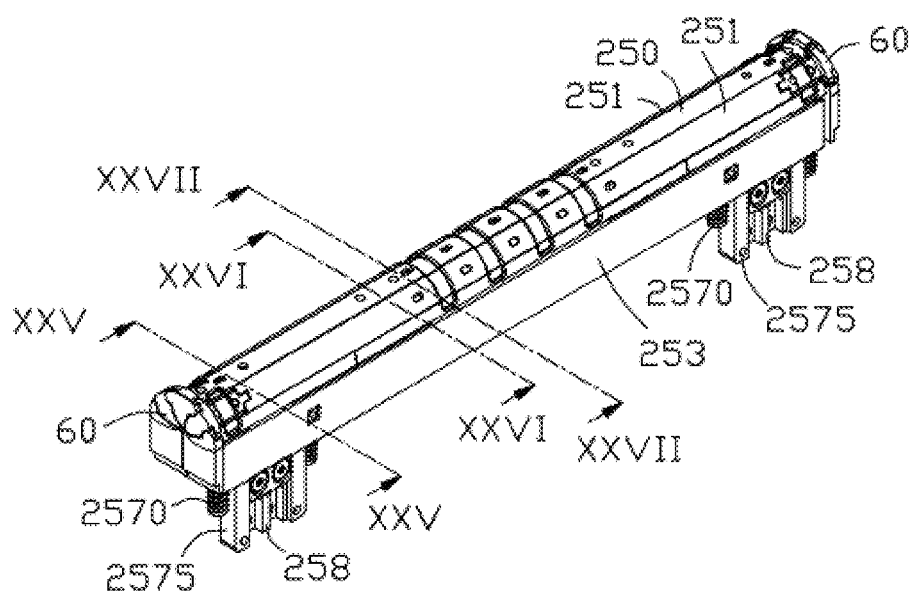
FIG. 24 is a schematic perspective view of the bent state of the bendable assembly of the electronic device of the present disclosure.
Figure 25:
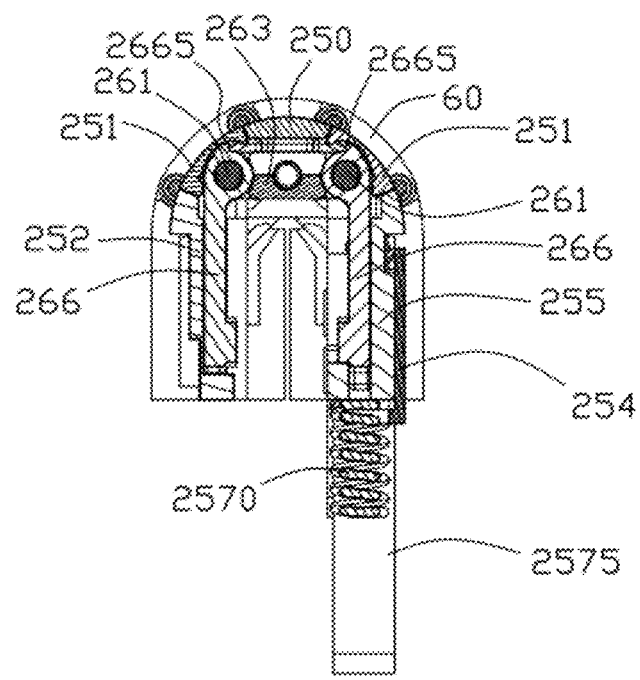
FIG. 25 is a cross-sectional view taken along line XXV-XXV in FIG. 24.
Figure 26:
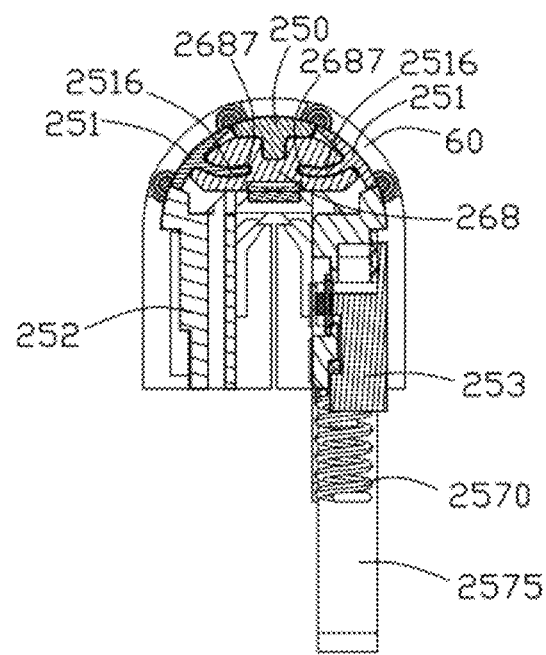
FIG. 26 is a cross-sectional view taken along line XXVI-XXVI in FIG. 24.
Figure 27:
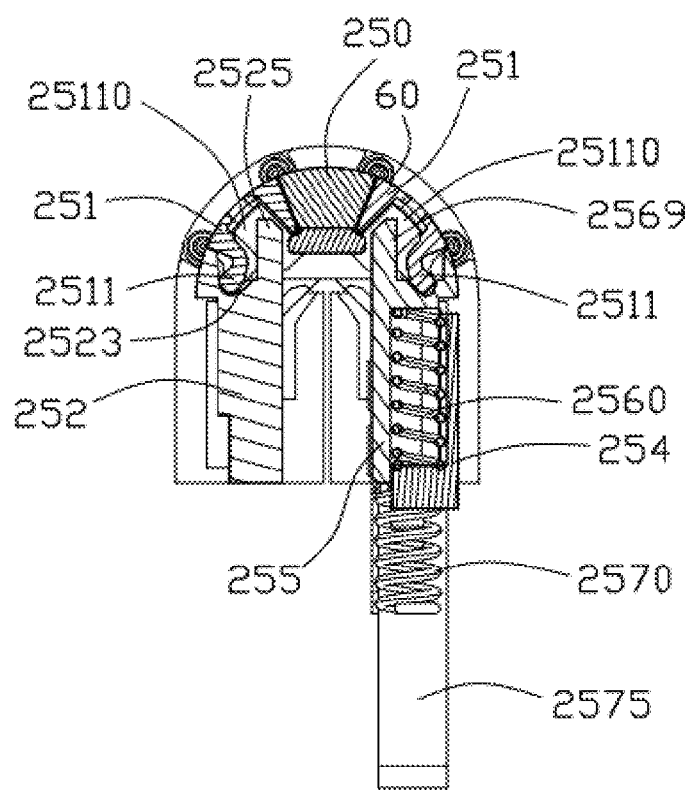
FIG. 27 is a cross-sectional view taken along line XXVII-XXVII in FIG. 24.

At this time, as shown in FIG. 18, two opposite hinge mechanisms 60 articulate the connecting hinge 252, compensation mechanism 253, two supporting hinges 251, and central hinge 250 in one body. Specifically, the connecting hinge 252 and the compensation mechanism 253 are respectively hinged with the corresponding two supporting hinges 251. The two supporting hinges 251 are hinged between the opposite sides of the connecting hinge 252 and the compensation mechanism 253 and the opposite sides of the central hinge 250 respectively.

Please referring to FIG. 1 to FIG. 5 together, the installed bendable assembly 24 is placed in the receiving slot 210 between the first frame 21 and the second frame 23, so that the two lugs 2575 of the compensation mechanism 253 are respectively received in the connecting members 230 of the second frame 23, the through holes 2581 of each sliding plate 258 respectively correspond to the mounting holes 235 of the mounting bar 234; a plurality of locking members are inserted into the through holes 2581 of the sliding plate 258 and locked in the corresponding mounting holes 235, so that the two sliding plates 258 are fixedly connected to the second frame 23 respectively. The second elastic members 2570 are located between the connecting member 255 and the second frame 23, the connecting member 255 can slide relative to the sliding plate 258, and the connecting hinge 252 is fixedly connected to the first frame 21. The supporting member 50 is covered on the front surface of the bendable assembly 24 and the front surface of the first frame 21. One side of the supporting member 50 is fixed to the first frame 21, and the other side of the supporting member 50 is fixed to the mounting frame 254. The bendable hinge or the connecting member of the bendable hinge can slide relative to the mounting frame 254. Alternatively, the first elastic members 2560 may be pre-compressed between the mounting frame 254 and the connecting member 230. The corresponding connecting ports 2505 on the central hinge 250 and the corresponding connecting ports 2515 on the adjacent supporting hinge 251 are connected to the supporting member 50 by colloid. Specifically, the colloid is separately dispensed into the dispensing ports 2504 of the central hinge 250 and the dispensing ports 2514 of the supporting hinge 251 through a dispensing device. The colloid in each dispensing port 2504 is filled into the corresponding connecting port 2515 to be connected with the back surface of the supporting member 50 so that the supporting member 50 and the bendable assembly 24 are connected. The supporting member 50 is fixedly connected to the front surface of the first frame 21. The back surfaces of the two non-bendable regions 33 of the flexible member 30 are respectively fixed to the supporting member 50 and the second frame 23 above the first frame 21, and the back surfaces of the bendable region 31 of the flexible member 30 are slidably covered to another part of the supporting member 50 above the bendable assembly 24. Alternatively, the second elastic members 2570 may be pre-compressed between the compensation mechanism 253 and the second frame 23. The colloid of the connecting groove 52 of the supporting member 50 is adhered to the back surface of the bendable region 31 of the flexible member 30. At this time, the back surface of the flexible member 30 is fixed on the first frame 21 and the second frame 23, the bendable region 31 of flexible member 30 can be bent as the bendable assembly 24 bends. The compensation mechanism 253 pushes the flexible member 30 away from the bendable assembly 24, so that the flexible member 30 has been a stretched state, which prevents flexible member 30 from arching and being damaged. When the flexible member 30 is in an unfolded state, one of the side surfaces 2589 of each positioning piece 2586 is positioned and attached to the corresponding first positioning surface 2579 to keep the bendable assembly 24 in the unfolded state.

Please referring to FIG. 23 to FIG. 27 together, when the electronic device 100 is bent, the bending force is applied to the first frame 21 and the second frame 23 of electronic device 100, so that the connecting hinge 252 and the compensation mechanism 253 connected to the first frame 21 and the second frame 23 are rotating towards a direction adjacent to each other. The rotating mechanism realizes the bending of the bendable assembly 24. Specifically, the bending force is applied to the first frame 21 and the second frame 23 together, the first frame 21 drives the connecting hinge 252 and the second frame 23 drives the compensation mechanism 253 to rotate toward one side away from the flexible member 30 relative to the supporting hinge 251. The two protrusions 2511 of one supporting hinge 251 are slidably inserted into the two inserting holes 2523 of the connecting hinge 252. The two extending blocks 2525 of the connecting hinge 252 are slidably inserted into the avoidance holes 25110 of one supporting hinge 251. One supporting hinge 251 rotates toward one side away from the flexible member 30 relative to the central hinge 250. The guide slide 2516 of one supporting hinge 251 is slidably inserted into the corresponding guide groove 2687. The two projections 2511 of the other supporting hinge 251 are slidably inserted into the two inserting holes of the compensation mechanism 253. The two extending blocks 2569 of the compensation mechanism 253 are slidably inserted into the avoidance holes 25110 of the other supporting hinge 251. The other supporting hinge 251 rotates toward one side away from the flexible member 30 relative to the central hinge 250. The guide slide 2516 of the other supporting hinge 251 is slidably inserted into the corresponding guide groove 2687. At the same time, the connecting hinge 252 and the compensation mechanism 253 drive the first linking member 266 and the second linking member 267 corresponding to the two rotating mechanisms 26 to rotate, so that the first linking member 266 slides along the corresponding first guide grooves 2527 and 2577, and the second linking member 267 slides along the corresponding second guide groove 2578. The second linking member 267 slidably pushes against the positioning piece 2586 to rotate the positioning piece 2586 so as to disengage from the first positioning surface 2579. The end of the second linking member 267 and the opposite sides of the sliding plate 258 gradually approach from the separation until they resist, to position the bendable assembly 24 in a bent state. The bendable region 31 of the flexible member 30 bends along with the bendable assembly 24 until the back surfaces of the first frame 21 and the second frame 23 are attached. When the bendable assembly 24 is unfolded again, the ends of the second linking member 267 are gradually separated from the side surface of the sliding plate 258, and the side surfaces of the positioning piece 2586 gradually approach the first positioning surface 2579 from the separated state until they are mutually opposed hold. Since the side surface of the positioning piece 2586 in the unfolded state abuts the first positioning surface 2579, the end of the second linking member 267 in the folded state abuts the side surface of the slide plate 258, so that the second frame 23 is limited in the unfolded state or in the bent state, reducing or avoiding the collapse caused by side impact (such as falling). Of course, in other embodiments, the second frame 23 may be limited only in the bent state or the unfolded state, and the corresponding structure may also be simplified.

Alternatively, during the bending process, the mounting frame 254 slides relative to the bendable hinge, and the second frame 23 slides relative to the bendable hinge. Alternatively, the mounting frame 254 slides in the direction of the first frame 21 or the bendable hinge relative to the bendable hinge, and the second frame 23 slides in the direction of the first frame 21 or the bendable hinge relative to the bendable hinge. Alternatively, a sliding distance of the second frame 23 relative to the bendable hinge is greater than that of the mounting frame 254 relative to the bendable hinge. Alternatively, the second frame slides relative to the hinge unit of the bendable hinge close to the second frame. The mounting frame slides relative to the hinge unit of the bendable hinge close the mounting frame. Alternatively, the second frame slides relative to the connecting member of the bendable hinge. The mounting frame slides relative to the connecting member of the bendable hinge. Alternatively, a sliding distance of the second frame relative to the connecting member of the bendable hinge is greater than that of the mounting frame relative to the connecting member of the bendable hinge. In the unfolding process, the mounting frame 254 slides relative to the bendable hinge, and the second frame 23 slides relative to the bendable hinge. Alternatively, the mounting frame 254 slides relative to the direction of the bendable hinge away from the first frame 21 or the direction of the bendable hinge, and the second frame 23 slides relative to the direction of the bendable hinge away from the first frame 21 or the direction of the bendable hinge. Alternatively, a sliding distance of the second frame 23 relative to the bendable hinge is greater than that of the mounting frame 254 relative to the bendable hinge. Alternatively, the second frame slides relative to the hinge unit of the bendable hinge close to the second frame. The mounting frame slides relative to the hinge unit of the bendable hinge close to the mounting frame. Alternatively, the second frame slides relative to the connecting member of the bendable hinge. The mounting frame slides relative to the connecting member of the bendable hinge. Alternatively, a sliding distance of the second frame relative to the connecting member of the bendable hinge is greater than a sliding distance of the mounting frame relative to the connecting member of the bendable hinge.

Alternatively, the second frame 23 and the mounting frame 254 slide in parallel with the bendable hinge. That is, the sliding of the second frame 23 relative to the bendable hinge does not depend on the mounting frame 254, and the sliding of the mounting frame 254 relative to the bendable hinge does not depend on the second frame 23. Alternatively, the second frame 23 and the mounting frame 254 are slid in parallel with the bendable hinge through respective elastic members 2563.

At this time, the bendable assembly 24 is bent, and the flexible member 30 bends along with bendable assembly 24, so that the upper surface of connecting hinge 252, the upper surface of supporting hinge 251, the upper surface of the central hinge 250, and the upper surface of the compensation mechanism 253 are connected to each other to form an arched arc, in order to facilitate fitting the supporting member 50. During the bending of the electronic device 100, the first elastic member 2560 is further compressed against the pressing piece 2542 of the mounting frame 254, and the second elastic member 2570 is further compressed against.

The first elastic members 2560 and the second elastic members 2570 are compressed when the bendable hinge is expanded and bent. The first elastic member 2560 is less compressed when the bendable hinge is expanded than the first elastic member 2560 is compressed when the bendable hinge is bent; the second elastic member 2570 is less compressed when the bendable hinge is expanded than the second elastic member 2570 is compressed when the bendable hinge is bent. When the bendable hinge is bent, the compression amount of the second elastic member 2570 is greater than that of the first elastic member 2560. When the bendable hinge is bent, the flexible member 30 and the supporting member 50 are relatively fixed at a position corresponding to the first frame 21, and relatively slide at a position corresponding to the bendable hinge.

The above is the implementation of the embodiments of the present disclosure. It should be noted that for those of ordinary skill in the art, several improvements and retouches can be made without departing from the principles of the embodiments of the present disclosure, and these improvements and retouches are also regarded as the protection scope of the present disclosure.

What is claimed is:

1. An electronic device, comprising a first frame, a second frame, a bendable hinge located between the first frame and the second frame, and a flexible member covering the first frame, the second frame and the bendable hinge, wherein, the electronic device further comprises a mounting frame located on one side of the bendable hinge, and a supporting member connecting the mounting frame and the first frame; the flexible member connects the first frame and the second frame; when the bendable hinge is bent, the supporting member drives the mounting frame to slide relative to the bendable hinge, and the flexible member drives the second frame to slide relative to the bendable hinge; wherein the electronic device further comprises at least one sliding plate connected to the second frame, and the at least one sliding plate is located between the second frame and the bendable hinge.

2. The electronic device according to claim 1, wherein the flexible member is fixedly connected to the first frame and the second frame.

3. The electronic device according to claim 1, wherein the supporting member is fixedly connected to the mounting frame and the first frame.

4. The electronic device according to claim 1, wherein an internal space of the first frame is larger than that of the second frame.

5. The electronic device according to claim 1, wherein the mounting frame is located between the second frame and the bendable hinge.

6. The electronic device according to claim 1, wherein the first frame and the bendable hinge are rigidly connected, and the second frame and the bendable hinge are elastically connected.

7. The electronic device according to claim 1, wherein the second frame and the mounting frame are slidably connected in parallel to the bendable hinge.

8. The electronic device according to claim 1, wherein the at least one sliding plate is embedded in the second frame.

9. The electronic device according to claim 1, wherein the mounting frame and the at least one sliding plate are stacked in a thickness direction of the electronic device.

10. The electronic device according to claim 1, wherein the mounting frame and the at least one sliding plate are partially staggered.

11. The electronic device according to claim 1, wherein the mounting frame and the at least one sliding plate are slidably connected by a locking member.

12. The electronic device according to claim 1, wherein the mounting frame slides relative to the at least one sliding plate when the bendable hinge is bent.

13. The electronic device according to claim 1, wherein a sliding distance of the mounting frame relative to the bendable hinge is less than that of the second frame relative to the bendable hinge.

14. The electronic device according to claim 1, wherein the bendable hinge comprises a connecting member, and the mounting frame is slidably disposed on the connecting member.

15. The electronic device according to claim 14, wherein two guide grooves and two guiding bars are defined between the connecting member and the mounting frame, and each of the two guiding bars is slidably inserted in one of the two guide grooves; the two guide grooves extend in a direction in which the mounting frame moves relative to the connecting member; the connecting member defines the two guide grooves separated from each other, and the mounting frame comprises the two guiding bars, each of the two guiding bars slidably inserts into one of the two guide grooves.

16. The electronic device according to claim 14, wherein the connecting member and the mounting frame are elastically connected by a first elastic member, and the connecting member and the second frame are elastically connected by a second elastic member; the connecting member comprises a receiving slot for receiving the mounting frame, the first elastic member is located in the receiving slot, and the second elastic member is located outside of the receiving slot.

17. The electronic device according to claim 16, wherein the mounting frame comprises a mounting plate and an abutting piece extending from the mounting plate, the mounting plate is connected to the supporting member, and the first elastic member is compressed between an inner wall of the receiving slot and the abutting piece.

18. The electronic device according to claim 16, wherein when the bendable hinge is expanded and bent, the first elastic member and the second elastic member are both compressed, and a compression degree of the first elastic member when the bendable hinge is expanded is less than that of the first elastic member when the bendable hinge is bent, and a compression degree of the second elastic member when the bendable hinge is expanded is less than that of the second elastic member when the bendable hinge is bent; when the bendable hinge is bent, an amount of compression of the second elastic member is greater than that of the first elastic member.

19. The electronic device according to claim 1, wherein when the bendable hinge is bent, the flexible member and the supporting member are relatively fixed relative to the first frame and slide relatively to a position corresponding to the bendable hinge.

* * * * *